United States Patent
Zang

(10) Patent No.: US 10,068,987 B1
(45) Date of Patent: Sep. 4, 2018

(54) VERTICAL FIELD EFFECT TRANSISTOR (VFET) HAVING A SELF-ALIGNED GATE/GATE EXTENSION STRUCTURE AND METHOD

(71) Applicant: GLOBALFOUNDRIES INC., Grand Cayman (KY)

(72) Inventor: Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/676,219

(22) Filed: Aug. 14, 2017

(51) Int. Cl.
| | |
|---|---|
| H01L 29/78 | (2006.01) |
| H01L 29/66 | (2006.01) |
| H01L 21/768 | (2006.01) |
| H01L 29/423 | (2006.01) |
| H01L 21/8234 | (2006.01) |

(52) U.S. Cl.
CPC .. H01L 29/66545 (2013.01); H01L 21/76897 (2013.01); H01L 21/823481 (2013.01); H01L 21/823487 (2013.01); H01L 29/42376 (2013.01); H01L 29/7827 (2013.01)

(58) Field of Classification Search
CPC ....... H01L 21/823487; H01L 29/42376; H01L 29/7827; H01L 29/66545; H01L 21/76897; H01L 21/823481; H01L 27/11273; H01L 27/2454; H01L 29/7828; H01L 29/66666; H01L 21/82285; H01L 21/823885
USPC ......... 257/288, 368, 369; 438/151, 197, 199
See application file for complete search history.

(56) References Cited

U.S. PATENT DOCUMENTS

| | | | |
|---|---|---|---|
| 9,190,466 B2 | 11/2015 | Basker et al. | |
| 9,437,503 B1 | 9/2016 | Mallela et al. | |
| 9,536,793 B1 | 1/2017 | Zhang et al. | |
| 9,570,356 B1 | 2/2017 | Balakrishnan et al. | |
| 9,680,473 B1 | 6/2017 | Anderson et al. | |
| 9,716,155 B2 | 7/2017 | Balakrishnan et al. | |
| 9,728,542 B1 * | 8/2017 | Balakrishnan .... | H01L 27/11206 |
| 9,786,758 B1 * | 10/2017 | Balakrishnan .......... | H01L 29/47 |
| 2014/0001572 A1 | 1/2014 | Bohr et al. | |
| 2014/0117454 A1 | 5/2014 | Liu et al. | |
| 2017/0309630 A1 * | 10/2017 | Cheng ................. | H01L 27/0924 |

* cited by examiner

*Primary Examiner* — Shahed Ahmed
(74) *Attorney, Agent, or Firm* — Gibb & Riley, LLC; Yuanmin Cai

(57) ABSTRACT

Disclosed are embodiments of a semiconductor structure that includes a vertical field effect transistor (VFET). The VFET has a fin-shaped body that includes a semiconductor fin and an isolation fin. The semiconductor fin extends vertically between lower and upper source/drain regions. The isolation fin is adjacent to and in end-to-end alignment with the semiconductor fin. The VFET gate has a main section that wraps around an outer end and opposing sidewalls of the semiconductor fin and an extension section that extends from the main section along at least the opposing sidewalls of a lower portion the isolation fin and, optionally, around an outer end of that lower portion. A gate contact lands on the isolation fin and extends along the opposing sidewalls and, optionally, the outer end of the isolation fin down to the extension section. Also disclosed are method embodiments for forming these structures.

20 Claims, 33 Drawing Sheets

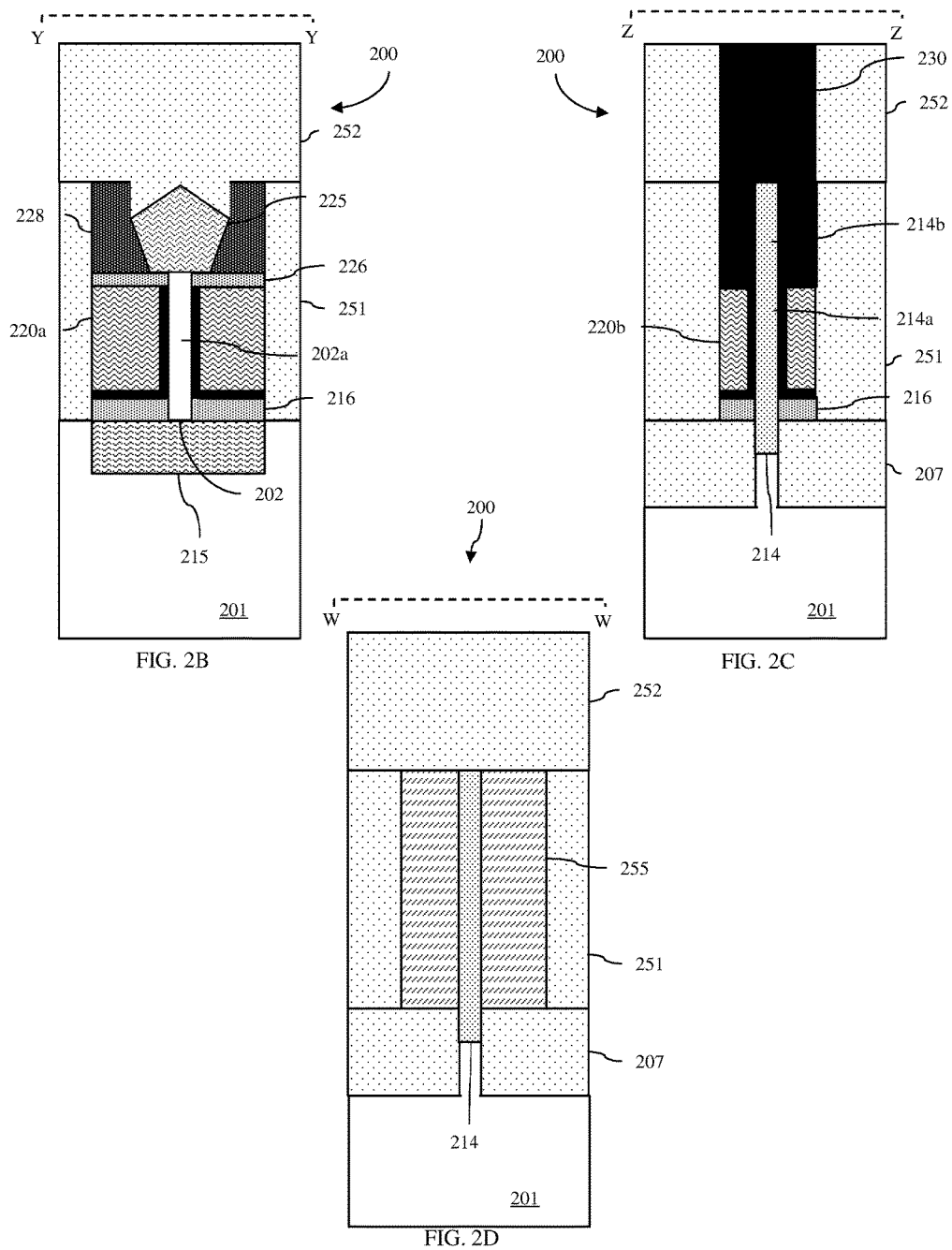

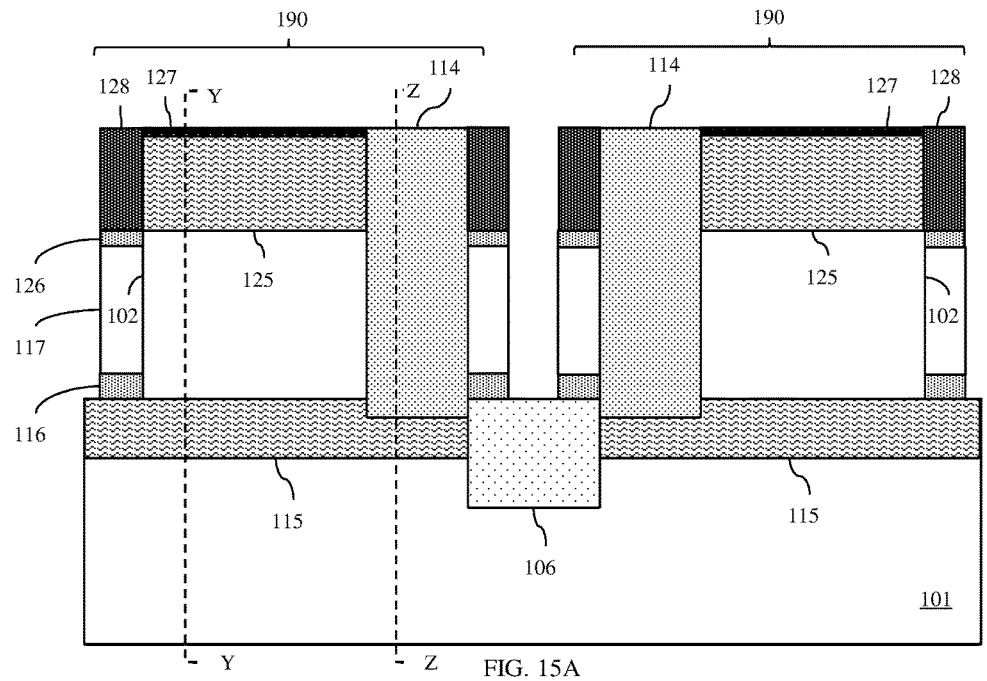
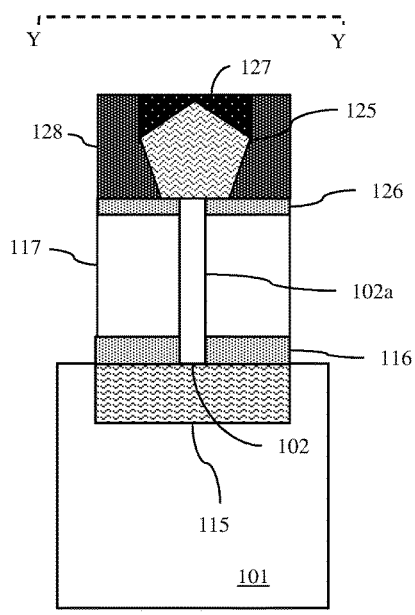
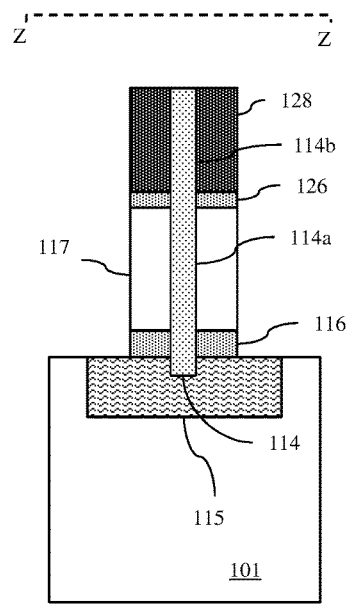
FIG. 15A
FIG. 15B
FIG. 15C

VERTICAL FIELD EFFECT TRANSISTOR (VFET) HAVING A SELF-ALIGNED GATE/GATE EXTENSION STRUCTURE AND METHOD

BACKGROUND

Field of the Invention

The present invention relates to vertical field effect transistors (VFETs) and, more particularly, a VFET with a combined gate/gate extension structure that is self-aligned and a method of forming the VFET.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths. Unfortunately, the smaller channel lengths resulted in a corresponding increase in short channel effects. In response, non-planar FET technologies have been developed.

Exemplary non-planar technologies include, for example, standard fin-type FETs (FINFETs) and vertical fin-type FETs (VFETs). A FINFET is a non-planar FET that incorporates a semiconductor fin (i.e., a relatively tall and thin, initial, rectangular-shaped, semiconductor body) and, within the semiconductor fin, a channel region positioned laterally between source/drain regions. A gate is positioned adjacent to the top surface and opposing sidewalls of the semiconductor fin at the channel region. A VFET is a non-planar FET that also incorporates a semiconductor fin (i.e., a relatively tall and thin, rectangular-shaped, semiconductor body). In this case, the FET components are stacked vertically on a substrate as opposed to being positioned side by side across a substrate in order to allow for increased device density (i.e., a greater number of devices within a given area). Specifically, a VFET typically includes a lower source/drain region in a substrate, a semiconductor fin that extends upward from the lower source/drain region, and an upper source/drain region that is epitaxially grown on the top surface of the semiconductor fin. A gate (e.g., a metal gate) laterally surrounds the semiconductor fin, which functions as the channel region, and is electrically isolated from the lower source/drain region and the upper source/drain region by lower and upper spacer layers, respectively. Each of these non-planar FET technologies consumes less chip surface area than a planar FET. Additionally, they exhibit multi-dimensional field effects as compared to the single-dimensional field effects exhibited by a planar FET and, thus, exhibit improved gate control over the channel.

As the device density (i.e., the number of devices per unit area) of IC designs continues to be increased, forming the above-mentioned non-planar FETs without violating design rules and/or risking the formation of defects (e.g., shorts) can be difficult. For example, recently IC designs have been developed with a reduced fin pitch of 36 nm or less in order to increase device density in an array of VFETs. This reduction in fin pitch necessarily requires a corresponding reduction in the gate pitch to minimize parasitic capacitance. One recently developed technique for reducing gate pitch is the formation of a self-aligned gate. However, the resulting self-aligned gate will be aligned below the upper source/drain region and, thus, a gate extension must also be formed immediately adjacent to the gate in order to provide a landing surface for the gate contact. Unfortunately, the added extension consumes additional chip area and, thus, cancels out any scaling benefit that could be achieved by reducing the fin pitch and the gate pitch.

SUMMARY

In view of the foregoing, disclosed herein are embodiments of a semiconductor structure that includes one or more vertical field effect transistors (VFETs), each having a combined gate/gate extension structure that is self-aligned. Specifically, each VFET has a fin-shaped body that includes a semiconductor fin and an isolation fin. The semiconductor fin extends vertically between a lower source/drain region in a substrate and an upper source/drain region. The isolation fin is positioned laterally immediately adjacent to and in end-to-end alignment with the semiconductor fin. A combined gate/gate extension structure includes a main section that wraps around an outer end and opposing sidewalls of the semiconductor fin and an extension section that extends from the main section along at least the opposing sidewalls of the isolation fin and, optionally, wraps around an outer end of the isolation fin. An upper portion of the isolation fin extends vertically above the extension section of the gate and a gate contact lands on the isolation fin and further extends vertically along the opposing sidewalls and, optionally, an outer end of the upper portion of the isolation fin down to the extension section of the gate. Given the self-alignment of this combined gate/gate extension structure, gate pitch can be reduced, no additional gate extension is required to provide a landing surface for the gate contact, and device density can be increased. Also disclosed herein are method embodiments for forming these structures.

More particularly, disclosed herein are embodiments of semiconductor structure. Each of the semiconductor structure embodiments can include at least one VFET. Each VFET can have a first source/drain region (also referred to herein as a lower source/drain region) in a semiconductor substrate. Each VFET can also have a fin-shaped body that includes a semiconductor fin and an isolation fin. The semiconductor fin can be above and immediately adjacent to the first source/drain region and can have a first top surface and first opposing sidewalls. The isolation fin can be positioned laterally immediately adjacent to and in end-to-end alignment with the semiconductor fin and can have a second top surface and second opposing sidewalls. Each VFET can further have a second source/drain region (also referred to herein as an upper source/drain region) on the first top surface of the semiconductor fin.

Each VFET can further include a gate with both a main section adjacent to the semiconductor fin and an extension section adjacent to the isolation fin. Specifically, the main section can be above the semiconductor substrate and adjacent to the first opposing sidewalls of the semiconductor fin and further wrapping around a first end (an outer end) of the semiconductor fin. The extension section can extend laterally from the main section, can be adjacent to the second opposing sidewalls and, optionally, a second end (an outer end) of the isolation fin. An upper portion of the isolation fin can extend vertically above the extension section of the gate.

The semiconductor structure can further include a gate contact that contacts the extension section of the gate. For example, the gate contact can land on the second top surface of the isolation fin and can extend downward to the extension section along the second opposing sidewalls and, optionally, along the second end of the isolation fin (e.g., in the case where the extension section wraps around the second end).

Also disclosed herein are embodiments of a method of forming the above-described semiconductor structures.

For example, one embodiment of the method can include forming one or more vertical field effect transistors (VFETs) on a substrate by forming a fin-shaped body on a substrate such that the fin-shaped body includes a semiconductor fin having first opposing sidewalls and an isolation fin positioned laterally immediately adjacent to and in end-to-end alignment with the semiconductor fin and having second opposing sidewalls. Source/drain regions can be formed, during processing, such that this semiconductor fin extends essentially vertically between a first source/drain region and a second source/drain region. A gate can be formed such that it has both a main section and an extension section. The main section can be adjacent to the first opposing sidewalls of the semiconductor fin and can further wrap around a first end (an outer end) of the semiconductor fin. The extension section can be adjacent to the second opposing sidewalls and can wrap around a second end (an outer end) of a lower portion of the isolation fin and an upper portion of the isolation fin can extend vertically above the extension section. Finally, a gate contact can be formed such that it extends vertically through interlayer dielectric (ILD) material to the extension section of the gate. For example, the gate contact can be formed so that it lands on the second top surface of the isolation fin and extends downward to the extension section along the second opposing sidewalls and the second end of the isolation fin.

Another embodiment of the method can also include one embodiment of the method can include forming a pair of vertical field effect transistors (VFETs) on a substrate by forming a fin-shaped body. In this case, the fin-shaped body is formed so that it includes a semiconductor fin, which has first opposing sidewalls, and an isolation fin, which has second opposing sidewalls and which is positioned laterally immediately adjacent to, between, and in end-to-end alignment with the semiconductor fin and an additional semiconductor fin. Source/drain regions for the VFETs can be formed, during processing, such that each semiconductor fin (i.e., the semiconductor fin and the additional semiconductor fin) extends essentially vertically between a first source/drain region and a second source/drain region. A gate can be formed such that it has both a main section and an extension section. The main section can be adjacent to the first opposing sidewalls of the semiconductor fin and can further wrap around an end (an outer end) of the semiconductor fin. The extension section can be adjacent to the second opposing sidewalls only of a lower portion of the isolation fin and an upper portion of the isolation fin can extend vertically above the extension section. Finally, a gate contact can be formed such that it extends vertically through interlayer dielectric (ILD) material to the extension section of the gate. For example, the gate contact can be formed so that it lands on the second top surface and extends downward to the extension section along the second opposing sidewalls of the isolation fin.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 2A-2D are different cross-section diagrams illustrating another embodiment of a semiconductor structure;

FIGS. 15A-15C are different cross section diagrams illustrating a partially completed structure formed according to the flow diagram of FIG. 3;

DETAILED DESCRIPTION

As mentioned above, as the device density (i.e., the number of devices per unit area) of integrated circuit (IC) designs continues to be increased, forming non-planar FETs without violating design rules and/or risking the formation of defects (e.g., shorts) can be difficult. For example, recently IC designs have been developed with a reduced fin pitch of 36 nm or less in order to increase device density in an array of VFETs. This reduction in fin pitch necessarily requires a corresponding reduction in the gate pitch to minimize parasitic capacitance. One recently developed technique for reducing gate pitch is the formation of a self-aligned gate. However, the resulting self-aligned gate will be aligned below the upper source/drain region and, thus, a gate extension must also be formed immediately adjacent to the gate in order to provide a landing surface for the gate contact. Unfortunately, the added extension consumes additional chip area and, thus, cancels out any scaling benefit that could be achieved by reducing the fin pitch and the gate pitch.

In view of the foregoing, disclosed herein are embodiments of a semiconductor structure that includes one or more vertical field effect transistors (VFETs), each having a combined gate/gate extension structure that is self-aligned. Specifically, each VFET has a fin-shaped body that includes a semiconductor fin and an isolation fin. The semiconductor fin extends vertically between a lower source/drain region in a substrate and an upper source/drain region. The isolation fin is positioned laterally immediately adjacent to and in end-to-end alignment with the semiconductor fin. A combined gate/gate extension structure includes a main section that wraps around an outer end and opposing sidewalls of the semiconductor fin and an extension section that extends from the main section along at least the opposing sidewalls of the isolation fin and, optionally, wraps around an outer end of the isolation fin. An upper portion of the isolation fin extends vertically above the extension section of the gate and a gate contact lands on the isolation fin and further extends vertically along the opposing sidewalls and, optionally, an outer end of the upper portion of the isolation fin down to the extension section of the gate. Given the self-alignment of this combined gate/gate extension structure, gate pitch can be reduced, no additional gate extension is required to provide a landing surface for the gate contact, and device density can be increased. Also disclosed herein are method embodiments for forming these structures.

Figure 1A:
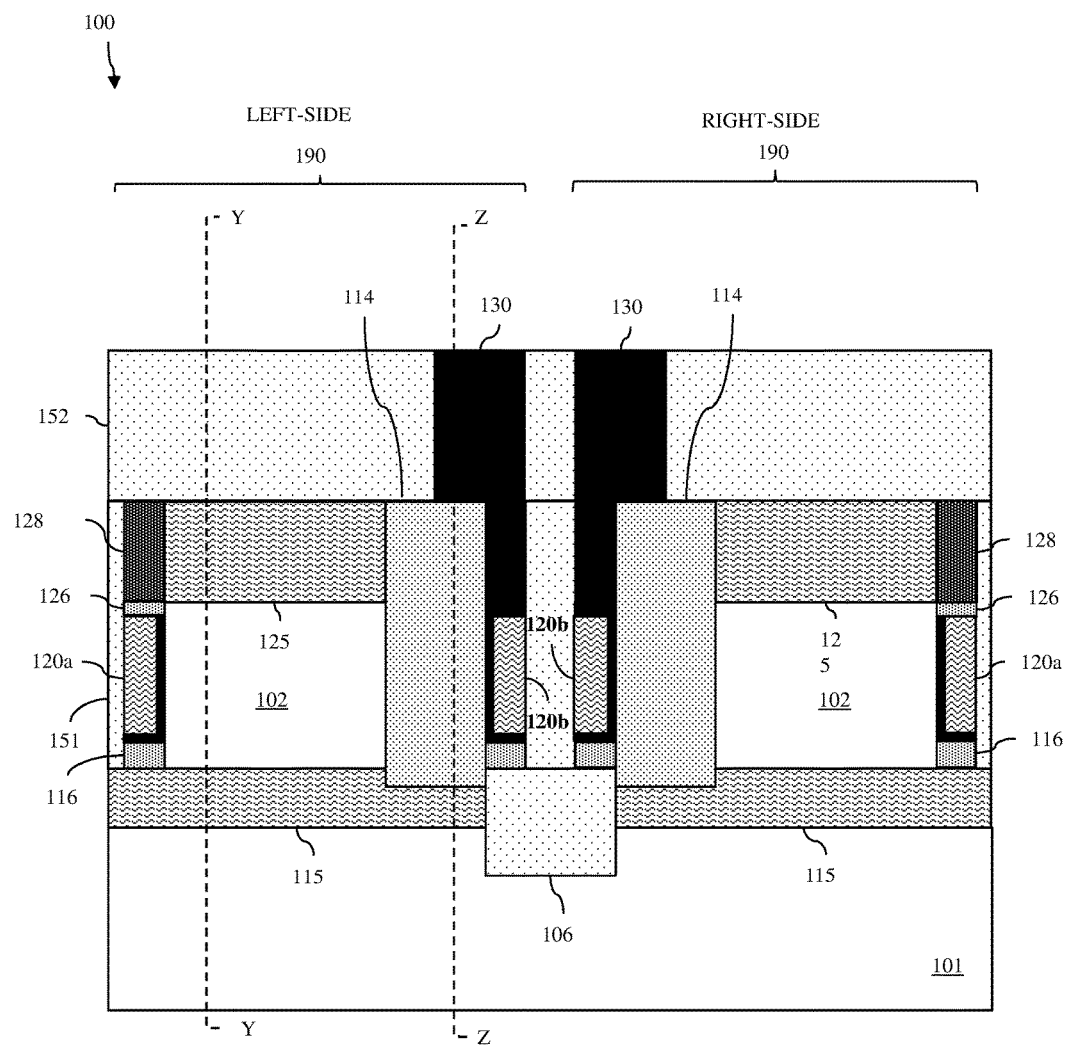
FIGS. 1A-1C are different cross section diagrams illustrating an embodiment of a semiconductor structure.
Figure 1B:
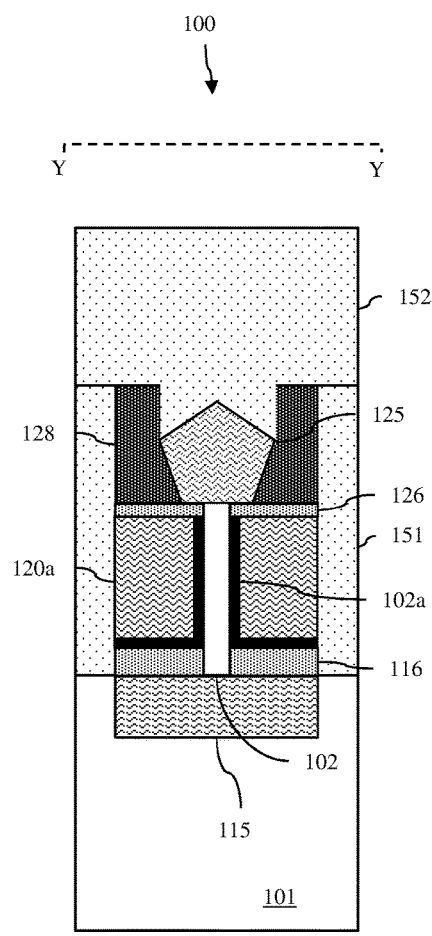
Figure 1C:
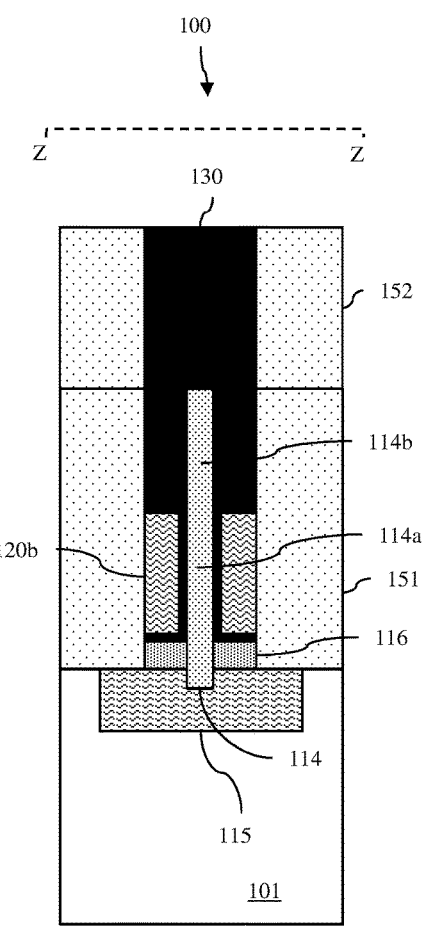
Figure 2A:
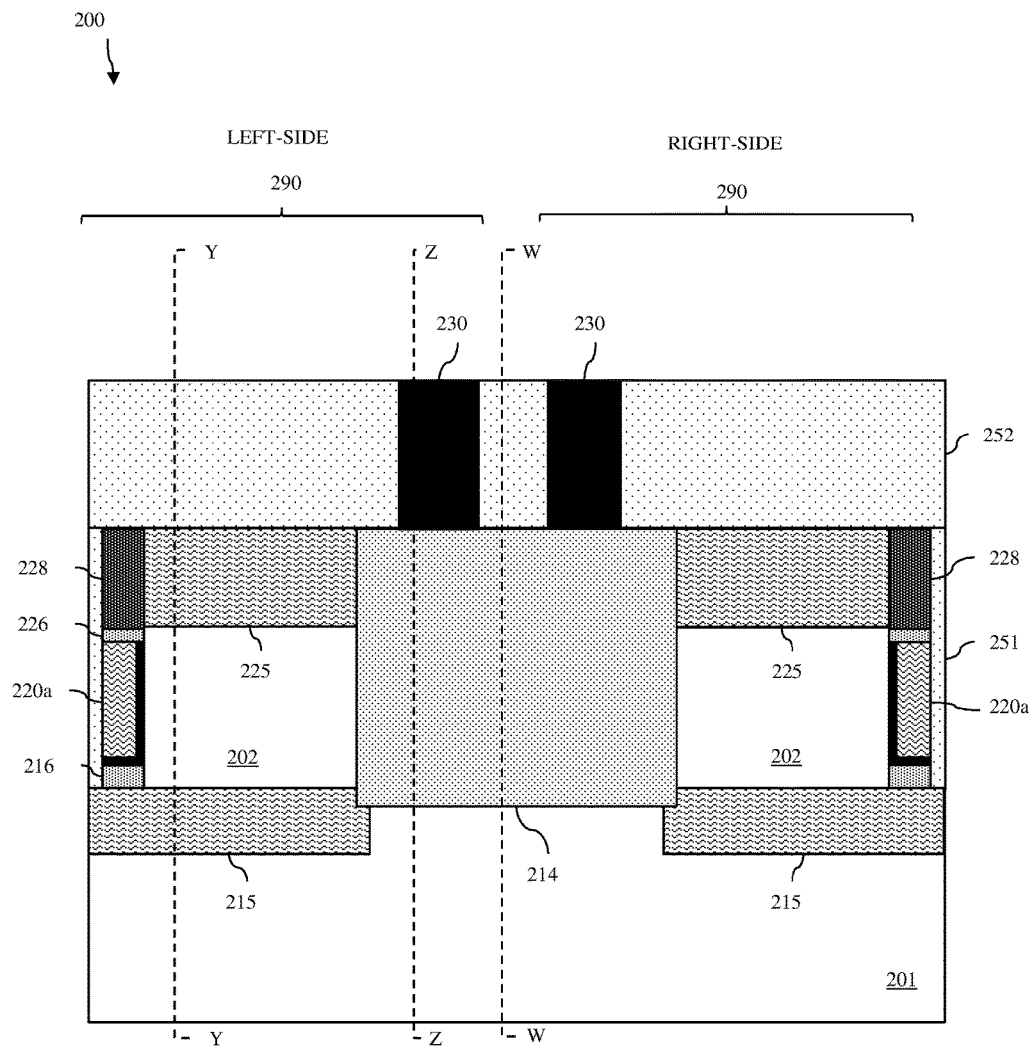

More particularly, FIGS. 1A-1C are different cross section diagrams of one embodiment 100 of the disclosed semiconductor structure and FIGS. 2A-2D are different cross-section diagrams of another embodiment 200 of the disclosed semiconductor structure.

Each of the semiconductor structure embodiments 100, 200 can include a semiconductor substrate 101, 201. The semiconductor substrate 101, 201 can be a bulk semiconductor substrate (e.g., a bulk silicon substrate), as illustrated. Alternatively, the semiconductor substrate 101, 201 can be a semiconductor layer above an insulator layer of a semiconductor-on-insulator wafer (e.g., a silicon layer above a buried oxide layer of a silicon-on-insulator (SOI) wafer).

Each of the semiconductor structure embodiments 100, 200 can also include one or more vertical field effect transistor (VFET) (see left and right side VFETs 190 of FIGS. 1A-1C; see also left and right side VFETs 290 of FIGS. 2A-2D) on the semiconductor substrate 101, 202. It should be noted that, due to the methods used to form these semiconductor structures (discussed in greater detail below), the left and right side VFETs 190 of FIGS. 1A-1C are essentially mirror images of each other. Similarly, the left and right side VFETs 290 of FIGS. 2A-2D are essentially mirror images of each other. The VFETs 190, 290 on the left and right sides can have the same type conductivity (e.g., both N-type VFETs or both P-type VFETs). Alternatively, the VFETs 190, 290 on the left and right sides can have different type conductivities (e.g., one N-type VFET and one P-type VFET).

Each VFET 190, 290 can include a first source/drain (S/D) region 115, 215 (also referred to herein as a lower S/D region) in the semiconductor substrate 101, 201. The first S/D region 115, 215 can be a dopant implant region within the semiconductor substrate 101, 201. Alternatively, the first S/D region 115, 215 can be an in-situ doped epitaxial semiconductor-filled trench within the semiconductor substrate 101, 201. Each VFET 190, 290 can also include a second S/D region 125, 225 (also referred to herein as an upper S/D region) some distance above the semiconductor substrate 101, 201. The second S/D region 125, 225 can be an in-situ doped epitaxial semiconductor region. The first S/D region 115, 215 and the second S/D region 125, 225 of each VFET 190, 290 can be doped so as to have the appropriate type conductivity at a relatively high conductivity level, given the type of VFET (e.g., N+ for an N-type VFET or P+ for a P-type VFET).

Each VFET 190, 290 can also include at least one fin-shaped body. For purposes of this disclosure, a fin-shaped body refers to a relatively tall, thin, essentially rectangular-shaped body. Furthermore, for purposes of illustration only a single fin-shaped body is shown. However, alternatively, each VFET 190, 290 could include multiple fin-shaped bodies.

In any case, each fin-shaped body can include a semiconductor fin 102, which extends essentially vertically between the first S/D region 115, 215 and the second S/D region 125, 225 forming a channel region, and an isolation fin 114, 214 positioned laterally immediately adjacent to and in end-to-end alignment with the semiconductor fin 102. For purposes of this disclosure, a semiconductor fin refers to a relatively tall, thin, essentially rectangular-shaped semiconductor body. Similarly, an isolation fin refers to a relatively tall, thin, essentially rectangular-shaped isolation body.

In any case, the semiconductor fin 102, 202 can have a first bottom surface, a first top surface opposite the first bottom surface, and first opposing sidewalls. The first bottom surface of the semiconductor fin 102, 202 can be immediately adjacent to the first S/D region 115, 215 and the first top surface of the semiconductor fin 102, 202 can be immediately adjacent to the second S/D region 125, 225 such that the semiconductor fin 102, 202 extends essentially vertically from the first S/D region 115, 215 to the second S/D region 125, 225. The semiconductor fin 102, 202 (i.e., the channel region) can either be undoped or doped so as to have the appropriate type conductivity at a relatively low conductivity level given the type of VFET (e.g., P- for an N-type VFET or N- for a P-type VFET).

The isolation fin 114, 214 can have a second bottom surface, a second top surface opposite the second bottom surface and second opposing sidewalls. The second bottom surface of the isolation fin 114, 214 can be adjacent to the substrate at or lower than the level of the first bottom surface of the semiconductor fin 102, 202. The isolation fin 114, 214 can further have a lower portion 114a, 214a, which is positioned laterally immediately adjacent to the semiconductor fin 102, 202, and an upper portion 114b, 214b, which is above the lower portion 114a, 214a and which is positioned laterally adjacent to the second S/D region 125, 225.

As illustrated in FIGS. 1A-1C, in the embodiment 100 each VFET 190 can have a discrete fin-shaped body that includes both the semiconductor fin 102 and the isolation fin 114. Specifically, within each discrete fin-shaped body, the semiconductor fin 102 can be above and immediately adjacent to the semiconductor substrate 101 and can have a first outer end and a first inner end opposite the first outer end. Furthermore, within each discrete fin-shaped body, the isolation fin 114 can be above and immediately adjacent to the semiconductor substrate 101 and can have a second inner end, which is positioned laterally immediately adjacent to the first inner end of the semiconductor fin 102, and a second outer end opposite the second inner end. Additionally, an isolation region 106 can be positioned within the semiconductor substrate 101 and can extend laterally between adjacent isolation fins 114 of adjacent fin-shaped bodies. The isolation region 106 can extend deeper into the semiconductor substrate 101 than the isolation fin 114.

As illustrated in FIGS. 2A-2D, in the embodiment 200, adjacent VFETs 290 can share a single fin-shaped body, which includes two semiconductor fins 202 (i.e., a semiconductor fin and an additional semiconductor fin) and an isolation fin 214 that is positioned laterally immediately adjacent to, between, and in end-to-end alignment with the two semiconductor fins 202. In this case, each semiconductor fin 202 can be above and immediately adjacent to the semiconductor substrate 201 and can have an outer end and an inner end opposite the outer end. The isolation fin 214 can also be above and immediately adjacent to the semiconductor substrate 201 and can have opposing ends adjacent to the inner ends of the two semiconductor fins 202, respectively. Isolation regions 207 can be positioned within the semiconductor substrate 201 immediately adjacent to the bottom edges of the opposing ends of the isolation fin 214, can extend laterally the full length of the isolation fin 214 from semiconductor fin to semiconductor fin, and can extend deeper into the semiconductor substrate 201 than the isolation fin 214.

It should be noted that in each of the VFETs 190, 290, the isolation fin 114, 214 can have the same width as the adjacent semiconductor fin(s) 102, 202, as illustrated. However, as discussed in greater detail below with regard to the method embodiments, the isolation fin 114, 214 could, alternatively, be wider than the adjacent semiconductor fin(s) 102, 202. It should also be noted that the above-mentioned isolation region(s) 106, 207 can be isolation trenches filled with a first isolation material (e.g., silicon dioxide or some other suitable isolation material). The isolation fin 114, 214 can be made of a second isolation material that is different from the first isolation material. For example, the second isolation material can be silicon nitride or any other suitable isolation material. For example, the second isolation material can be a low-K dielectric material. Those skilled in the art will recognize that a low-K dielectric material is a dielectric material having a dielectric constant that is lower than the dielectric constant of silicon dioxide and, particularly, that is lower than 3.9. Exemplary isolation materials that can be used for the second isolation material of the isolation fin 114, 214 can include, but are not limited to, silicon nitride (SiN), silicon oxynitride (SiON), carbon-doped silicon oxynitride (SiONC), carbon-doped silicon (SiC), silicon carbon nitride (SiCN), silicon oxycarbide (SiCO), hydrogenated silicon oxycarbide (SiCOH), etc.

Each VFET 190, 290 can further include a gate that has both a main section 120a, 220a and an extension section 120b, 220b. The main section 120a, 220a can be positioned above the first S/D region 115, 215 and can further be positioned laterally to the semiconductor fin 102, 202, thereby defining a channel region for the VFET 190, 290 within the semiconductor fin 102, 202. Specifically, the main section 120a, 220a can be positioned laterally immediately to the first opposing sidewalls of the semiconductor fin 102, 202 and can further wrap around the first outer end of the semiconductor fin 102, 202. The extension section 120b, 220b can extend laterally from the main section 120a, 220a and can be positioned laterally to a lower portion 114a, 214a of the isolation fin 114, 214. Specifically, the extension section 120b, 220b can be positioned laterally immediately adjacent to the second opposing sidewalls of the isolation fin 114, 214 and, in the case of the embodiment shown in FIGS. 1A-1C, can wrap around the second outer end of the isolation fin 114. Additionally, an upper portion 114b, 214b of the isolation fin 114, 214 can extend vertically above the level of the top surface of the gate at the extension section 120b.

As illustrated in FIGS. 1A-1C, in the embodiment 100, side portions of the extension section 120b that are adjacent to the second opposing sides of the isolation fin 114 will be above and immediately adjacent to the semiconductor substrate 101. However, an end portion of the extension section 120b that wraps around the second outer end of the isolation fin 114 will be above the trench isolation region 106.

As illustrated in FIGS. 2A-2D, in the embodiment 200 side portions of the extension section 220b that are positioned laterally immediately adjacent to the second opposing sidewalls of the isolation fin 214 will be above the isolation regions 207. It should be noted that in the embodiment 200, the left and right side VFETs 290 can share a gate and, particularly, an extension section of a continuous self-aligned gate that wraps around the shared fin-shaped (not shown). Alternatively, during processing, gate cut isolation regions 255 can be formed through side portions of the gate adjacent to the second opposing sidewalls of the isolation fin 214 in order to physically separate and electrically isolate left and right-side extension sections 220b for the left and right side VFETs 290 (see FIG. 2D).

In any case, the above-mentioned gate for each of the VFETs 190, 290 (including the main section 120a, 220a and the extension section 120b, 220b) can include a conformal gate dielectric layer immediately adjacent to vertical surfaces of the semiconductor fin 102, 202 and a gate conductor layer on the gate dielectric layer. See more detailed discussion below regarding the possible gate dielectric and gate conductor materials.

Each VFET 190, 290 can further include a first spacer layer 116, 216 (also referred to herein as a lower spacer layer), which is stacked between the gate (including the main section and the extension section) and the semiconductor substrate 101, 201 and isolation region(s) 106, 207 and which electrically isolates the gate from the semiconductor substrate 101, 201 below and, particularly, from the first S/D region 115, 215 contained therein.

Each VFET 190, 290 can also include a second spacer layer 126, 226 on the top surface of the gate (including the main section and the extension section). As mentioned above, the second S/D region 125, 225 can be on the first top surface of the semiconductor fin 102, 202. A dielectric sidewall spacer 128, 228 can be above the second spacer layer 126, 226 and can laterally surround the second S/D region 125, 225 and adjacent upper portion 114*b*, 214*b* of the isolation fin 114, 214. This second spacer layer 126, 226 and the protective dielectric sidewall spacer 128, 228 can electrically isolate the second S/D region 125, 225 from the gate. The first spacer layer 116, 216 and the second spacer layer 126, 226 can be made of the same dielectric material or different dielectric materials (e.g., low-K dielectric material (s)), which are different from the first isolation material and the second isolation material. The dielectric sidewall spacer 128, 228 can be made of a different dielectric material than the spacer layers.

Each of the semiconductor structure embodiments 100, 200 can further include multiple layers 151-152, 251-252 of interlayer dielectric (ILD) material that laterally surrounds and covers the structure. The ILD material can be any of silicon dioxide, borophosphosilicate glass (BPSG), tetraethyl orthosilicate (TEOS), fluorinated tetraethyl orthosilicate (FTEOS), etc.

Each of the semiconductor structure embodiments 100, 200 can further include at least one gate contact 130, 230, which extends essentially vertically through the ILD material to the extension section 120*b*, 220*b* of the gate. As illustrated in FIGS. 1A-1C, in the embodiment 100, a gate contact 130 for each VFET 190 can, for example, land on the second top surface of the isolation fin 114 and can further extend along the second opposing sidewalls and second outer end of the upper portion 114*b* of the isolation fin 114 down to the top surface of the extension section 120*b*. As illustrated in FIGS. 2A-2D, in the embodiment 200, since the isolation fin 214 is between two semiconductor fins 202, a gate contact 230 can land on the second top surface of the isolation fin 214 and can further extend essentially vertically along the second opposing sidewalls only of the upper portion 214*b* of the isolation fin 214 down to the top surface of the extension section 220*b*. It should be noted that, if the VFETs 290 share a gate, as discussed above (e.g., if no gate cut isolation region 255 is formed), a single gate contact may be used (not shown). However, if the VFETs 290 have discrete gates separated by gate cut isolation regions 255 (as illustrated), gate contacts 230 for each of the VFETs 290 will land on the second top surface of the isolation fin 214 and extend down to the extension sections 220*b* of the gates, respectively.

Those skilled in the art will recognize that the VFETs 190, 290 may include additional features that are not shown in the figures (e.g., S/D contacts to the first and second S/D regions, etc.). Such features are well known in the art and, thus, the details have been omitted from this specification and form the figures in order to allow the reader to focus on the salient aspects of the disclosed structure embodiments.

Figure 3:
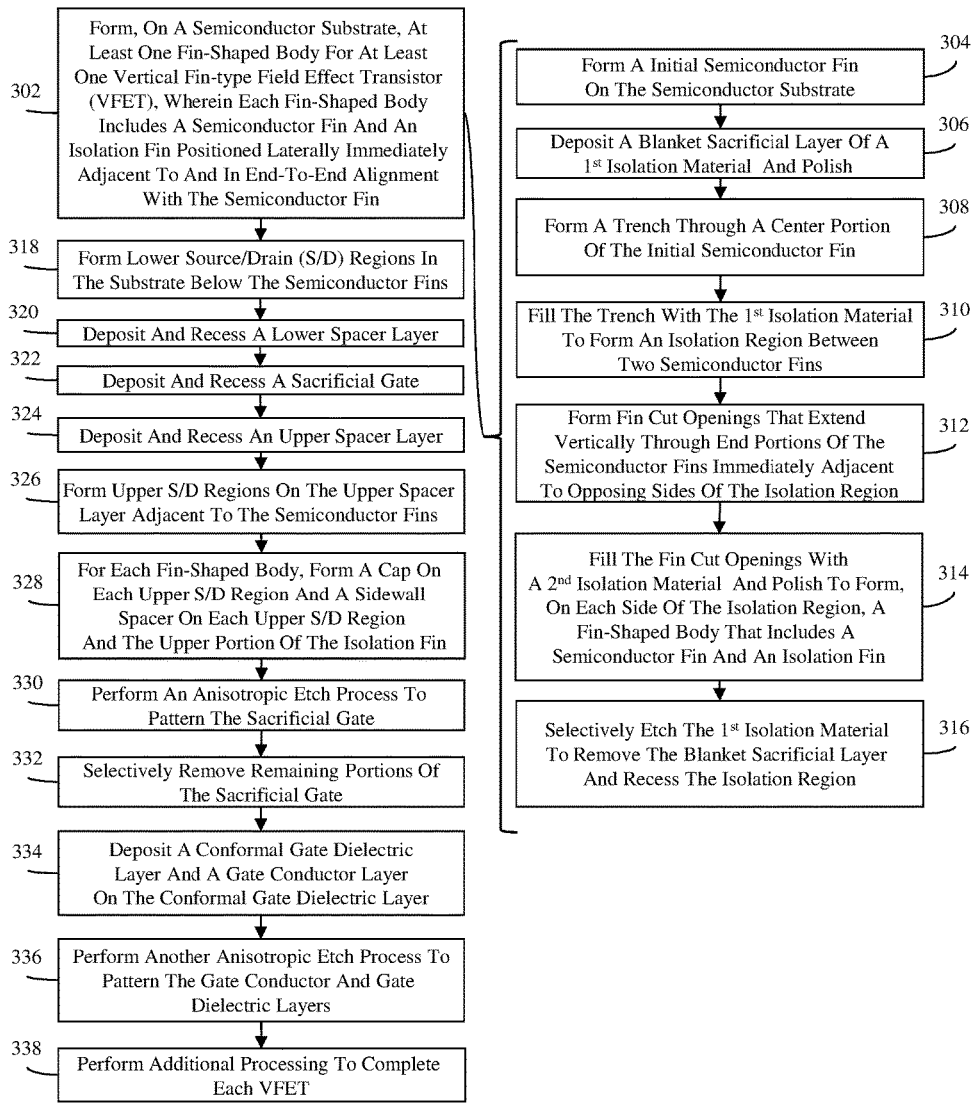
FIG. 3 is a flow diagram illustrating a method of forming the semiconductor structure of FIGS. 1A-1C.

Referring to the flow diagram of FIG. 3, also disclosed herein are embodiments of a method of forming the semiconductor structure shown in FIGS. 1A-1C. This method embodiment can include providing a substrate 101. The substrate 101 can be a bulk semiconductor substrate (e.g., a bulk silicon substrate). Alternatively, the substrate 101 can be a semiconductor layer above an insulator layer of a semiconductor-on-insulator wafer (e.g., a silicon layer above a buried oxide layer of a silicon-on-insulator (SOI) wafer).

Optionally, the semiconductor substrate 101 can include, for a pair of adjacent VFETs 190, first source/drain (S/D) regions (also referred to herein as lower S/D regions, not shown), which were previously formed at some predetermined depth below the top surface of the substrate 101. The VFETs 190 being formed according to the method can have the same type conductivity or different type conductivities. Thus, the first source/drain (S/D) region for each VFET 190 can have the appropriate type conductivity at a relatively high conductivity level, given the type of VFET being formed (e.g., N+ for an N-type VFET or P+ for a P-type VFETs). Such first S/D regions could be formed, for example, by performing a masked dopant implantation process to form deep well regions below the top surface of the semiconductor substrate in different VFET regions. Alternatively, any other suitable technique could be used to form such first source/drain regions. For example, the semiconductor substrate 101 can include multiple semiconductor layers and, particularly, a first semiconductor layer with trenches filled with epitaxial semiconductor material (i.e., first source/drain regions) and a second semiconductor layer on the first semiconductor layer and extending laterally over the first source/drain regions. The epitaxial semiconductor material of the first source/drain regions can be the same or different than that of the semiconductor substrate 101.

Figure 4A:
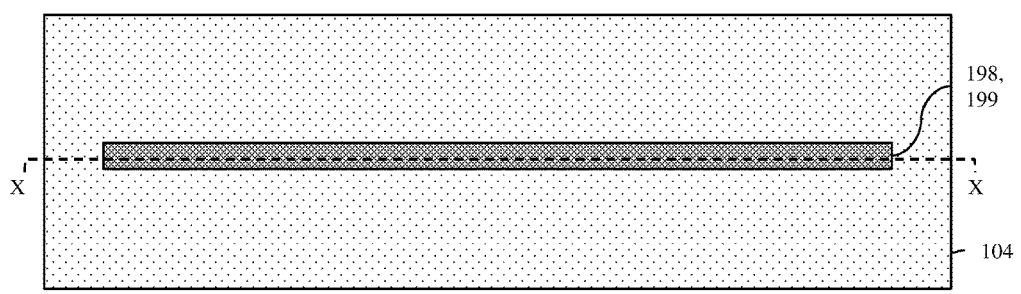
FIGS. 4A and 4B are top view and cross section diagrams, respectively, illustrating a partially completed structure formed according to the flow diagram of FIG. 3.
Figure 4B:
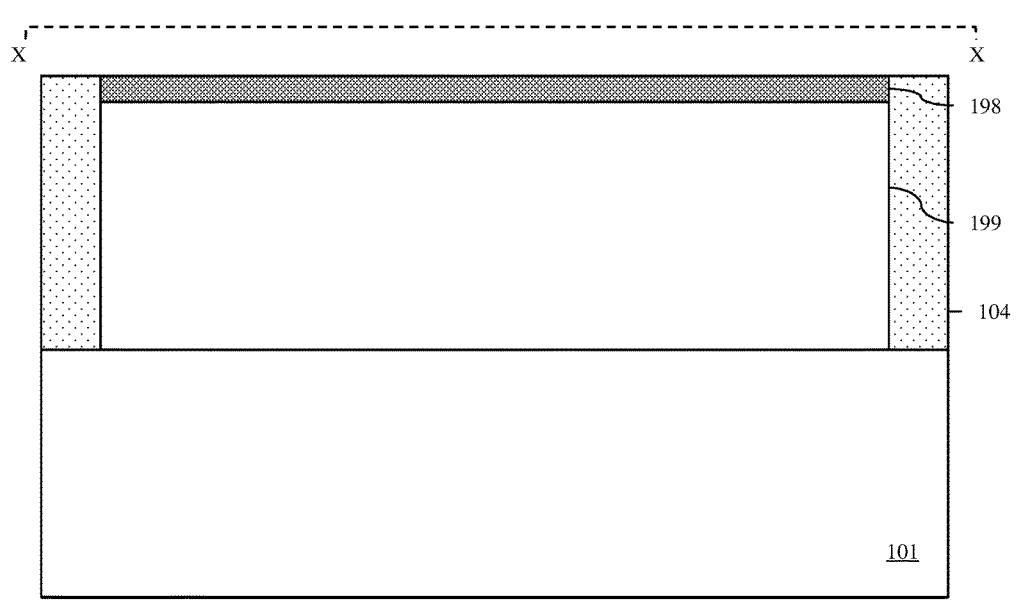

One or more fin-shaped bodies, each of which includes a semiconductor fin and an isolation fin, can be formed on the semiconductor substrate 101 (see process 302). For example, an initial semiconductor fin 199 with a dielectric cap 198 can first be formed on the semiconductor substrate 101 (see process 304 and FIGS. 4A-4B). This initial semiconductor fin 199 with the dielectric cap 198 can be patterned and etched into the upper portion of the semiconductor substrate. Techniques for patterning semiconductor fins (e.g., conventional lithographic patterning techniques, sidewall image transfer patterning techniques, etc.) are well known in the art and, thus, the details have been omitted from the specification in order to allow the reader to focus on the salient aspects of the disclosed embodiments.

A blanket sacrificial layer 104 can be deposited onto the semiconductor substrate 101 and over the initial semiconductor fin 199 with the dielectric cap 198. The blanket sacrificial layer can be made of a first isolation material (e.g., silicon dioxide or some other suitable isolation material) (see process 306 and FIGS. 4A-4B). The blanket sacrificial layer 104 can be polished (e.g., using a chemical mechanical polishing (CMP) process) to expose the top of the dielectric cap 198.

Figure 5A:
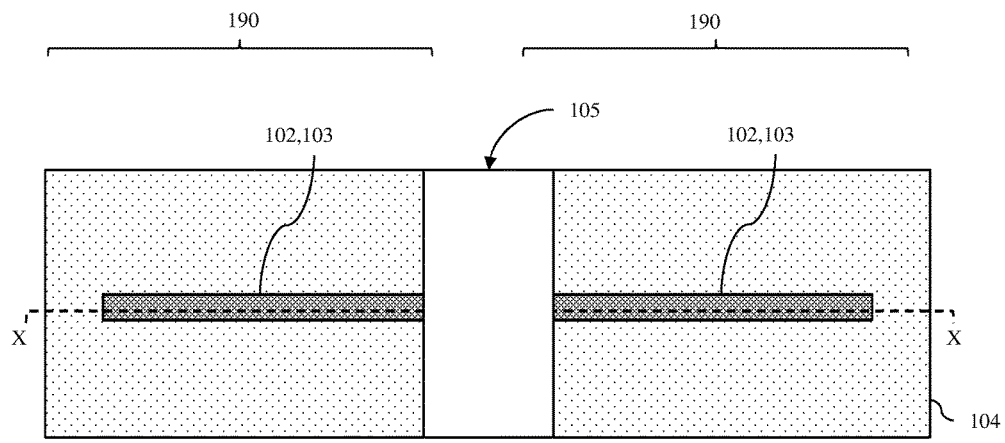
FIGS. 5A and 5B are top view and cross section diagrams, respectively, illustrating a partially completed structure formed according to the flow diagram of FIG. 3.
Figure 5B:
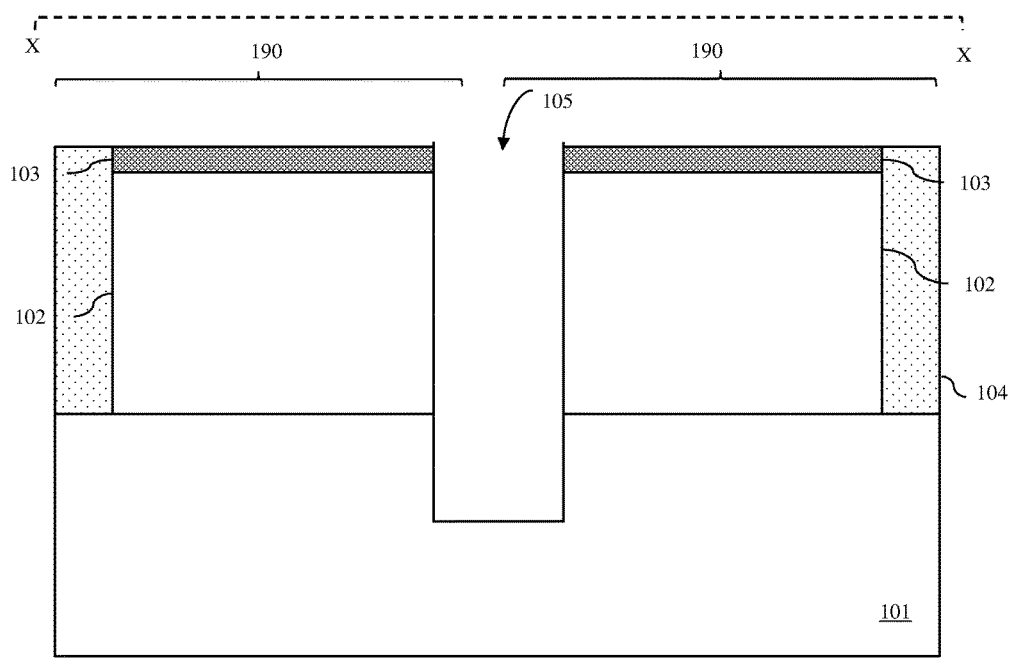

A trench 105 can then be formed (e.g., lithographically patterned and etched) so that it completely traverses the initial semiconductor fin 199, extending essentially vertically through the dielectric cap 198 and initial semiconductor fin 199 and through the adjacent portions of the blanket sacrificial layer 104 into the substrate 101 (see process 308 and FIGS. 5A-5B). The trench 105, thus, divides the initial semiconductor fin 199 with the dielectric cap 198 into two semiconductor fins 102 (i.e., a semiconductor fin and an additional semiconductor fin) with corresponding dielectric caps 103. As discussed in greater detail below, the semiconductor fin 102 and the additional semiconductor fin can be used to form vertical field effect transistor (VFETs) 190 (i.e., a VFET and an additional VFET, respectively) that are essentially mirror images of each other.

It should be noted that, if first S/D regions for the VFETs 190 were previously formed, processes 302-308 should be performed such that the semiconductor fins 102 are above and immediately adjacent to the first S/D regions. It should also be noted that each semiconductor fin 102 for each VFET 190 can either be undoped or, at some point during processing before or after formation, doped so as to have the appropriate type conductivity at a relatively low conductivity level given the type of VFET being formed (e.g., P- for an N-type VFET and N- for a P-type VFET).

Figure 6A:
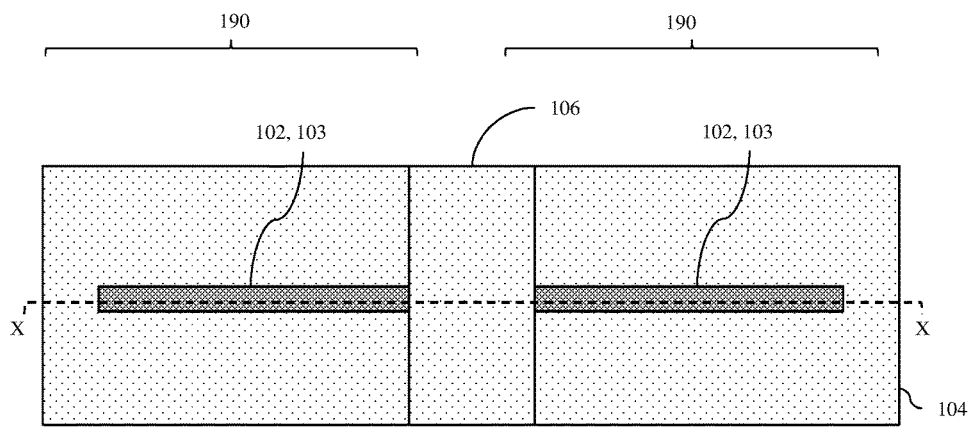
FIGS. 6A and 6B are top view and cross section diagrams, respectively, illustrating a partially completed structure formed according to the flow diagram of FIG. 3.
Figure 6B:
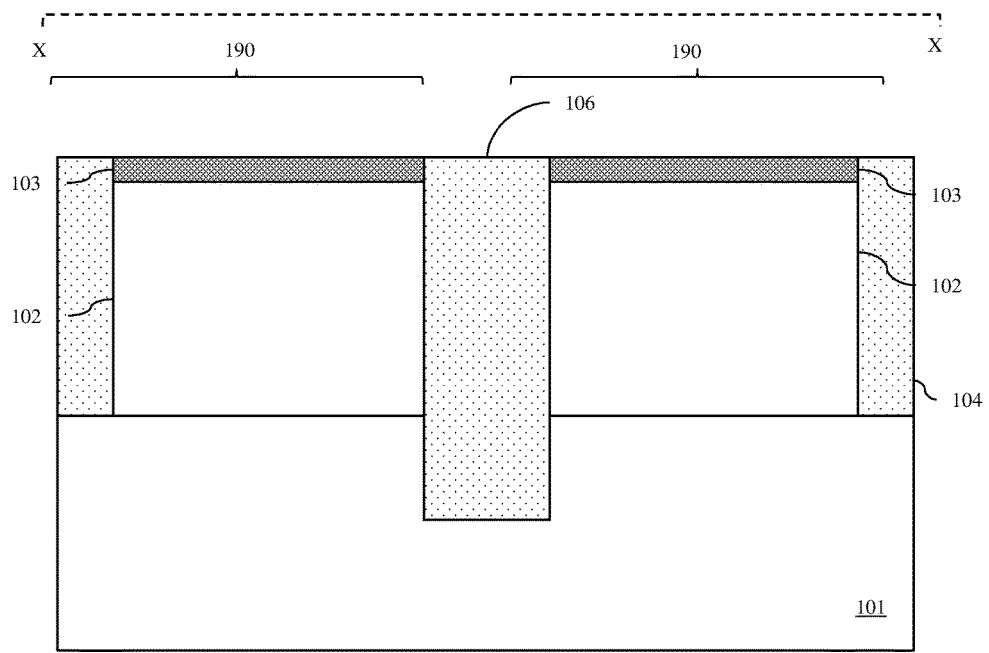

Another layer of the first isolation material can be deposited so as to fill the trench 105. A polishing process (e.g., a CMP process) can then be performed so as to create an isolation region 106 within the trench and positioned laterally between the two semiconductor fins 102 (see process 310 and FIGS. 6A-6B).

Figure 7A:
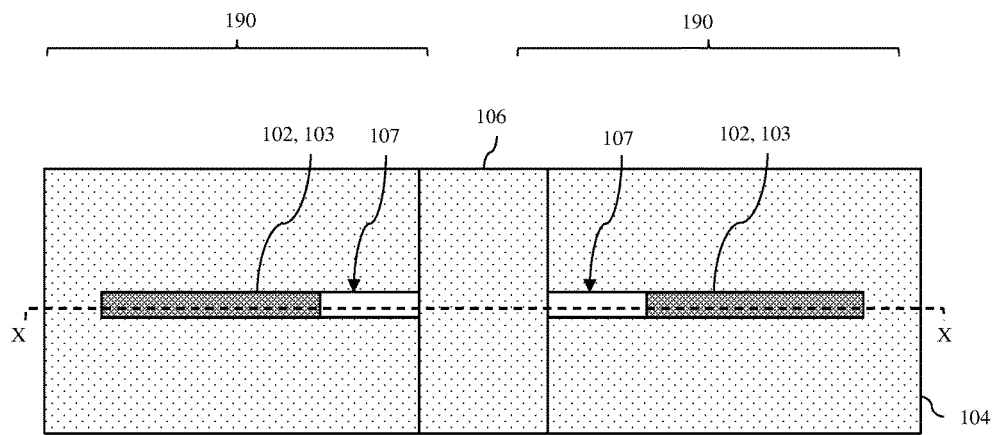
FIGS. 7A and 7B are top view and cross section diagrams, respectively, illustrating a partially completed structure formed according to the flow diagram of FIG. 3.
Figure 7B:
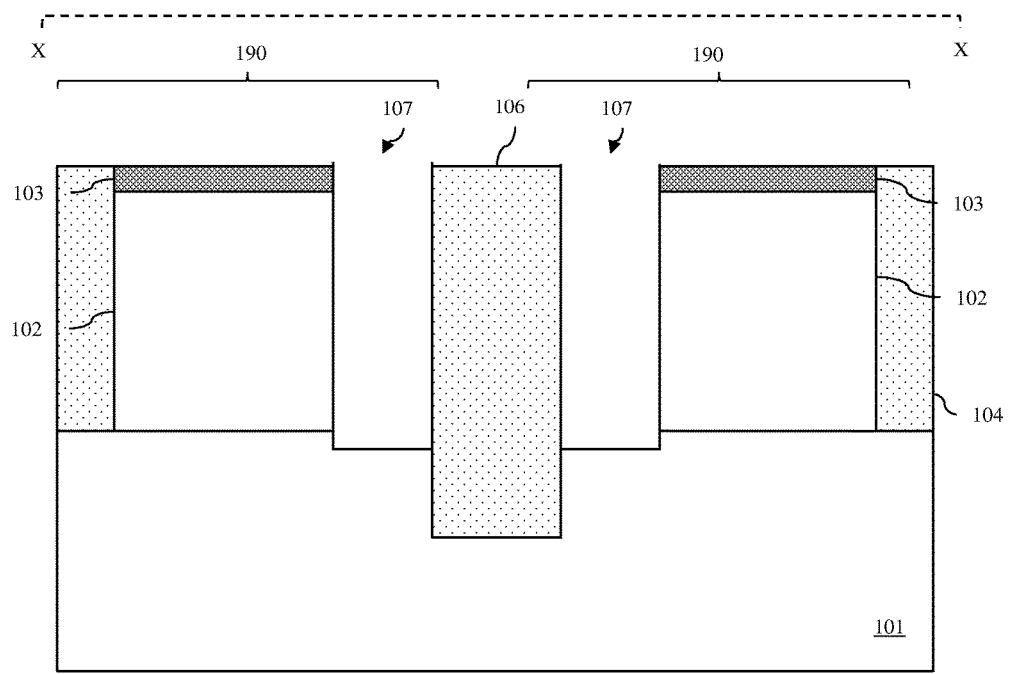
Figure 8A:
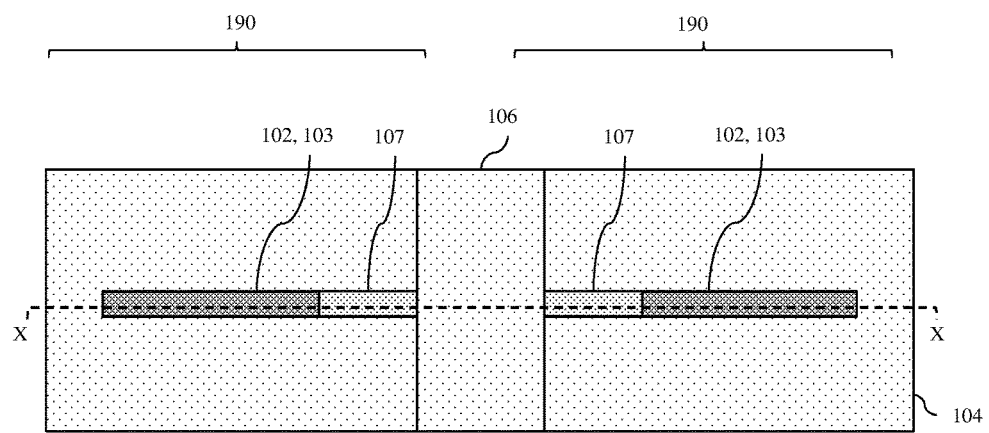
FIGS. 8A and 8B are top view and cross section diagrams, respectively, illustrating a partially completed structure formed according to the flow diagram of FIG. 3.
Figure 8B:
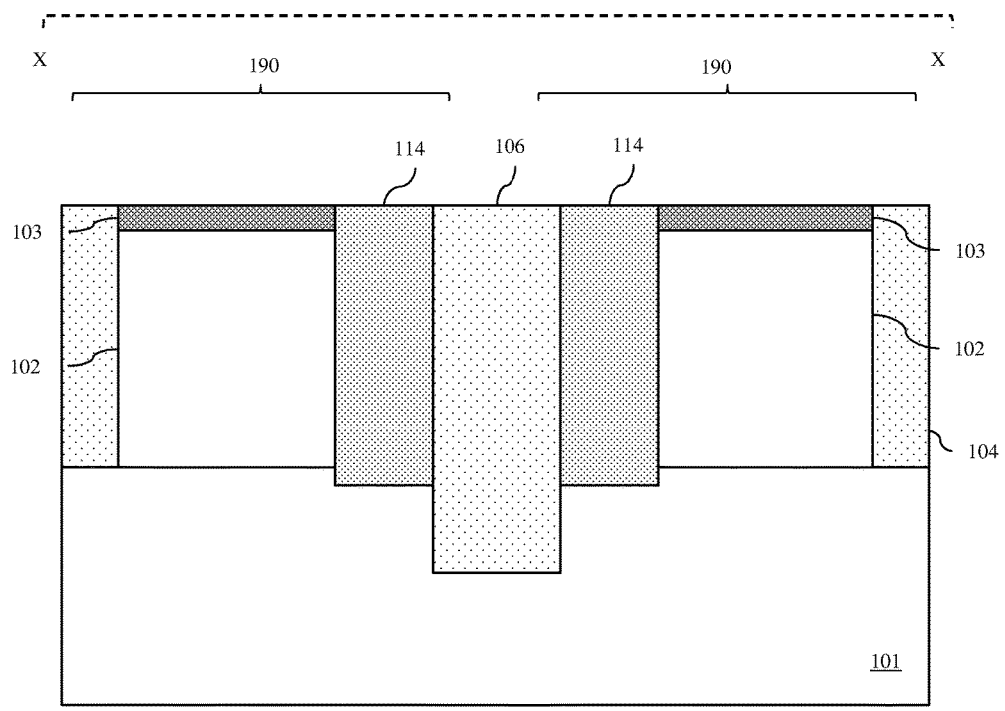

Next, an end portion of each semiconductor fin 102 that is immediately adjacent to the isolation region 106 can be replaced by an isolation fin. For example, fin cut openings 107 can be formed such that they extend essentially vertically through those portions of the semiconductor fins that abut the isolation region 106 (see process 312 and FIGS. 7A-7B). For example, a mask layer can be formed on the sacrificial layer 104. The mask layer can be lithographically patterned and etched with fin cut openings aligned above the end portions of the semiconductor fins 102 adjacent to the isolation region 106. Then, a selective anisotropic etch process can be performed in order to extend the fin cut openings 107 through the dielectric cap 103. The etch chemistries can then be changed in order to further extend the fin cut openings 107 through the semiconductor fins 102 and into the semiconductor substrate 101. Etching can be stopped when the bottom surfaces of the fin cut openings 107 are at or below the level of the bottom surfaces of the semiconductor fins 102 but above the level of the bottom surface of the isolation region 106. Then, a layer of a second isolation material can be deposited so as to fill the fin cut openings 107. Another polishing process (e.g., another CMP process) can then be performed to form isolation fins 114 within the fin cut openings 107 and positioned laterally between the semiconductor fins 102 and the isolation region 106, respectively (see process 314 and FIGS. 8A-8B). The second isolation material can be silicon nitride or any other suitable isolation material. For example, the second isolation material can be a low-K dielectric material. Those skilled in the art will recognize that a low-K dielectric material is a dielectric material having a dielectric constant that is lower than the dielectric constant of silicon dioxide and, particularly, that is lower than 3.9. Exemplary isolation materials that can be used for the second isolation material of the isolation fin 114 can include, but are not limited to, silicon nitride (SiN), silicon oxynitride (SiON), carbon-doped silicon oxynitride (SiONC), carbon-doped silicon (SiC), silicon carbon nitride (SiCN), silicon oxycarbide (SiCO), hydrogenated silicon oxycarbide (SiCOH), etc. In any case, the second isolation material should be different from the first isolation material and also different from the dielectric material used for the dielectric cap 198.

As illustrated, the processes described above will result in a pair of fin-shaped bodies, each having a semiconductor fin 102 and an isolation fin 114. The semiconductor fin 102 has a first outer end, a first inner end opposite the first outer end and first opposing sidewalls. The isolation fin 114 has a second inner end that abuts the first inner end of the semiconductor fin 102, a second outer end opposite the second inner end and second opposing sidewalls. Thus, the semiconductor fin 102 and isolation fin 114 are in end-to-end alignment.

Figure 9:
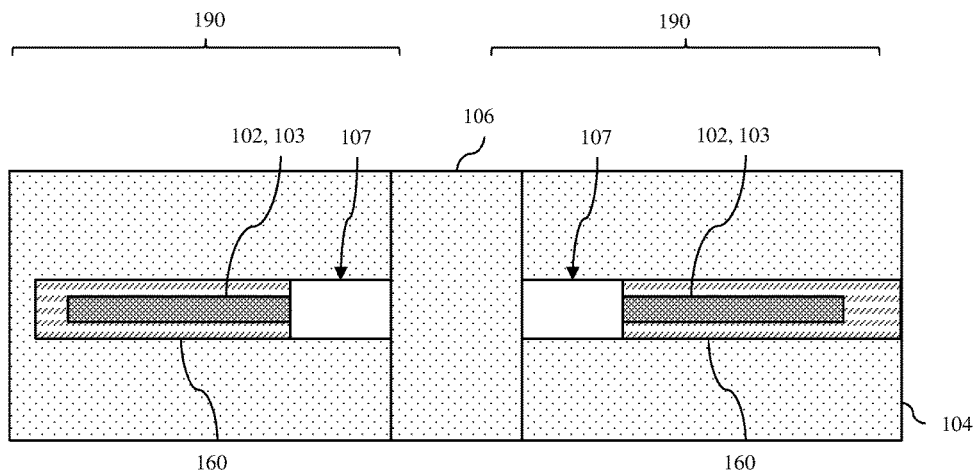
FIGS. 9 and 10 are cross section diagrams illustrating alternative process steps.
Figure 10:
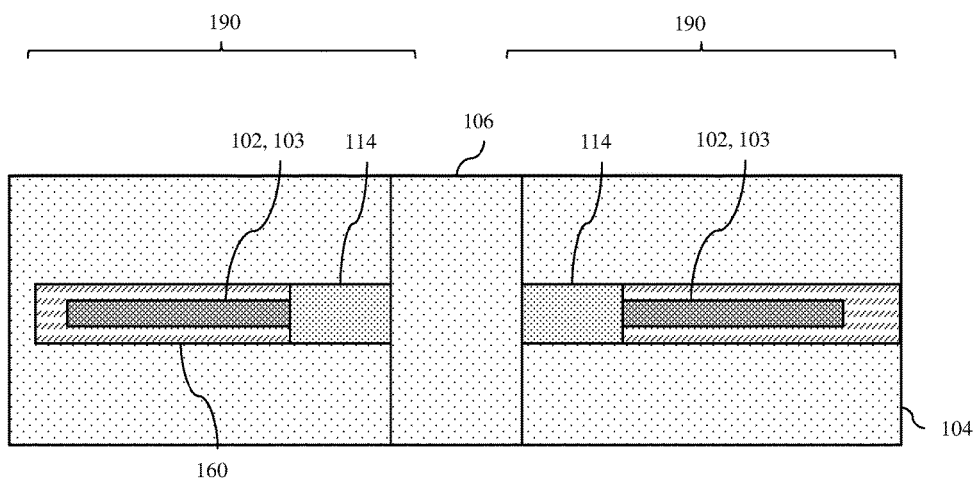

Additionally, as illustrated the processes described above will result in the isolation fin 114 having essentially the same width as the adjacent semiconductor fin 102. However, alternatively, before depositing the blanket sacrificial layer 104, a sacrificial sidewall spacer 160 could be formed. In this case, the fin cut openings 107 can cut through, not only the end portions of the semiconductor fins 102, but also the adjacent sidewall spacer material. Thus, the fin cut openings will be wider than the semiconductor fins (as shown in FIG. 9). Then, when the fin cut openings are filled, the resulting isolation fins 114 will also be wider than the semiconductor fins 102 (see FIG. 10).

Figure 11A:
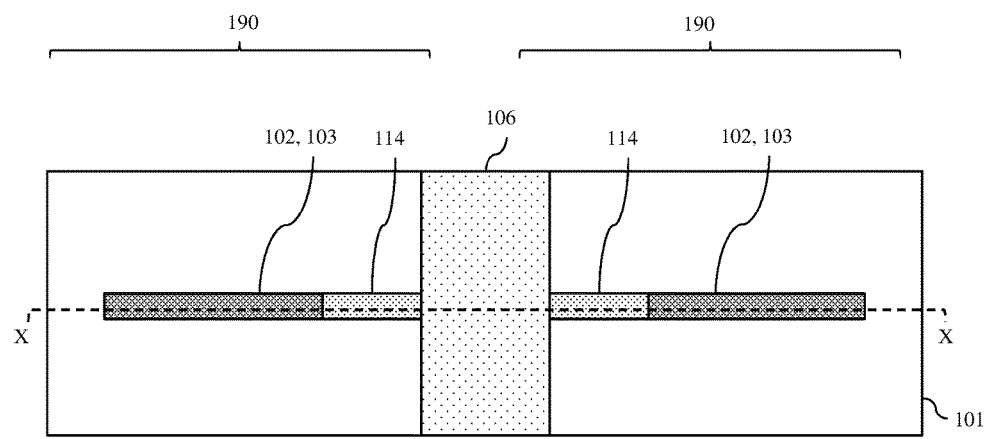
FIGS. 11A and 11B are top view and cross section diagrams, respectively, illustrating a partially completed structure formed according to the flow diagram of FIG. 3.
Figure 11B:
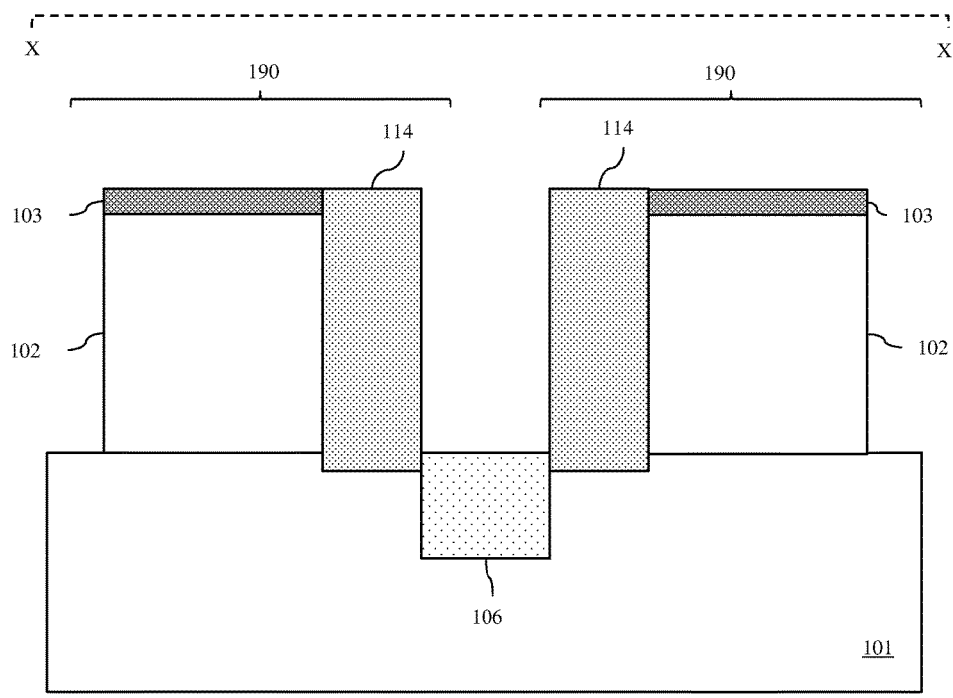

Next, the first isolation material (of the blanket sacrificial layer 104 and the isolation region 106) can be selectively and anisotropically etched back in order to completely remove the blank sacrificial layer 104 and also recess the top surface of the isolation region 106 to a level that is at or below the top surface of the semiconductor substrate 101 (see process 316 and FIGS. 11A-11B). This etch process will expose the top surface of the semiconductor substrate 101 and, at each fin-shaped body, the first outer end and first opposing sidewalls of the semiconductor fin 102 and the second outer end and second opposing sidewalls of the isolation fin 114. The sacrificial sidewall spacer 160, if present, would also be selectively removed at this time.

Figure 12A:
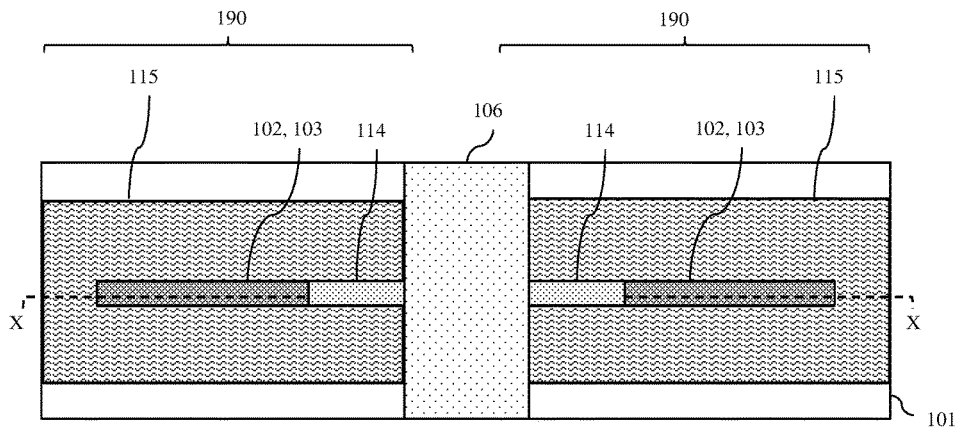
FIGS. 12A and 12B are top view and cross section diagrams, respectively, illustrating a partially completed structure formed according to the flow diagram of FIG. 3.
Figure 12B:
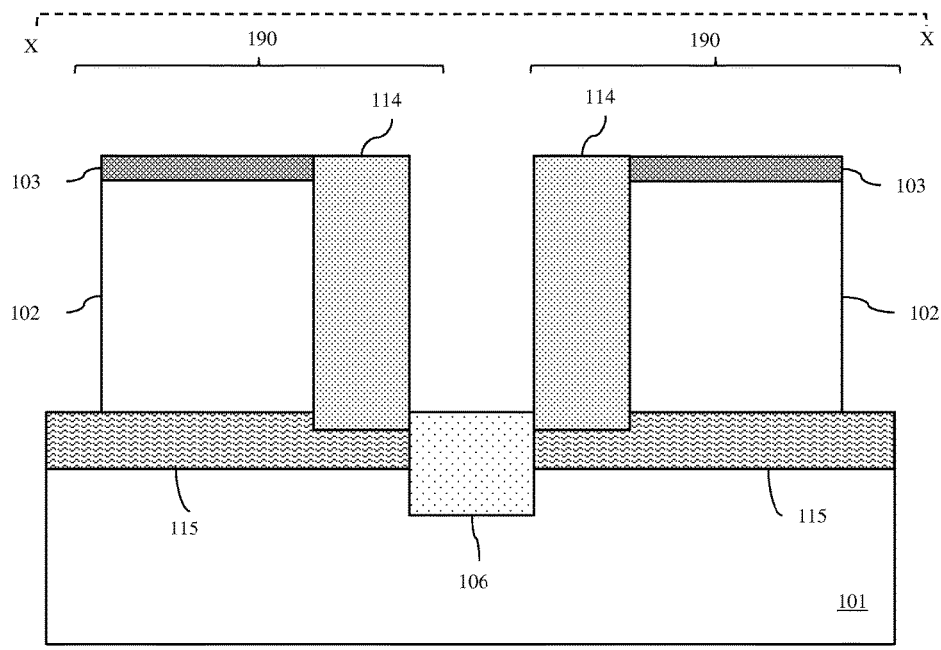

If the first source/drain regions for the VFETs 190 were not previously formed, as discussed above, they can now be formed in the semiconductor substrate 101 immediately adjacent to the bottoms of the semiconductor fins 102 (see process 318 and FIGS. 12A-12B). The first source/drain regions 115 can be formed, for example, as dopant implant regions, doped epitaxial semiconductor regions, etc. Various different techniques for forming such source/drain regions for VFETs are well known in the art and, thus, the details have been omitted from this specification in order to allow the reader to focus on the salient aspects of the disclosed methods. As mentioned above, the first S/D region 115 of each VFET 190 can be doped so as to have an appropriate type conductivity at a relatively high conductivity level, given the type of VFET being formed (e.g., N+ for an N-type VFET or P+ for a P-type VFET).

Additional processing can be performed in order to complete each of the VFETs 190. This additional processing can include, but is not limited to, formation of second S/D regions (also referred to as upper S/D regions) for the VFETs 190, formation of self-aligned gates for the VFETs 190, formation of gate contacts for the VFETs 190, etc. Those skilled in the art will recognize that various different techniques for forming these features are well known in the art. However, with any of these techniques, the inclusion of the isolation fin 114 within the fin-shaped body will ensure that the gate formation process results, not just in a self-aligned gate adjacent to the semiconductor fin, but in a combined gate/gate extension structure that is self-aligned.

The following exemplary processes for completing the VFETs 190 are offered for illustration purposes and are not intended to be limiting. Alternatively, any other suitable processes could be performed to complete the VFETs 190.

Figure 13A:
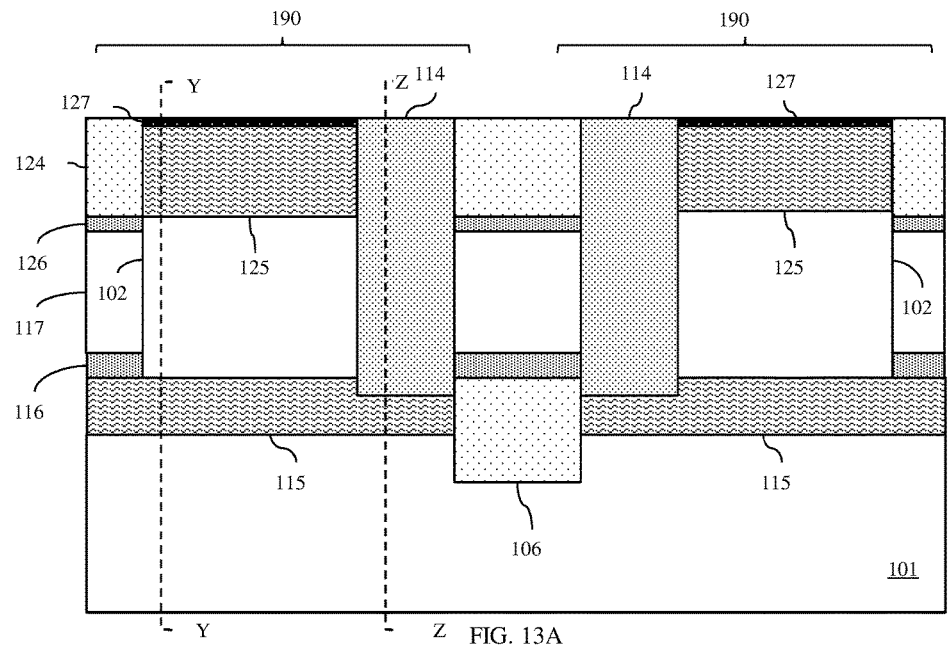
FIGS. 13A-13C are different cross section diagrams illustrating a partially completed structure formed according to the flow diagram of FIG. 3.
Figure 13B:
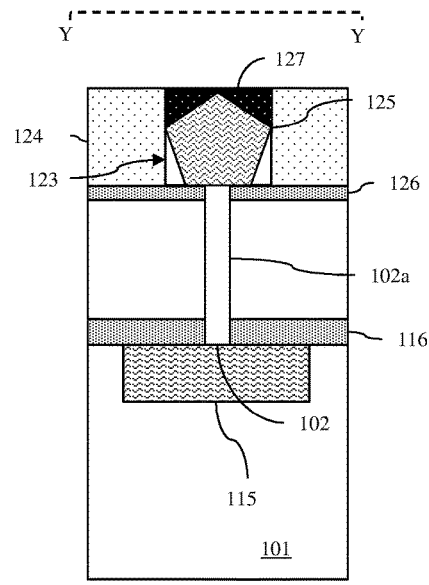
Figure 13C:
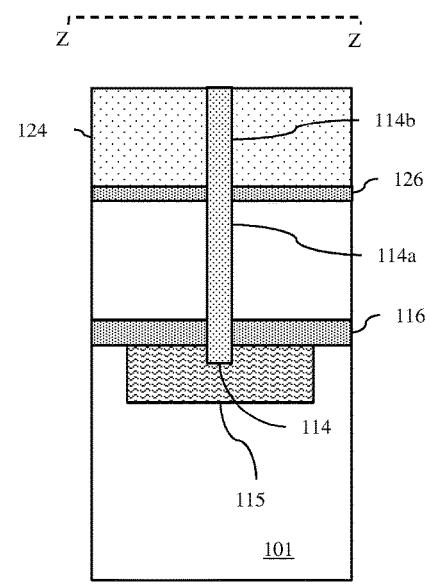
Figure 14A:
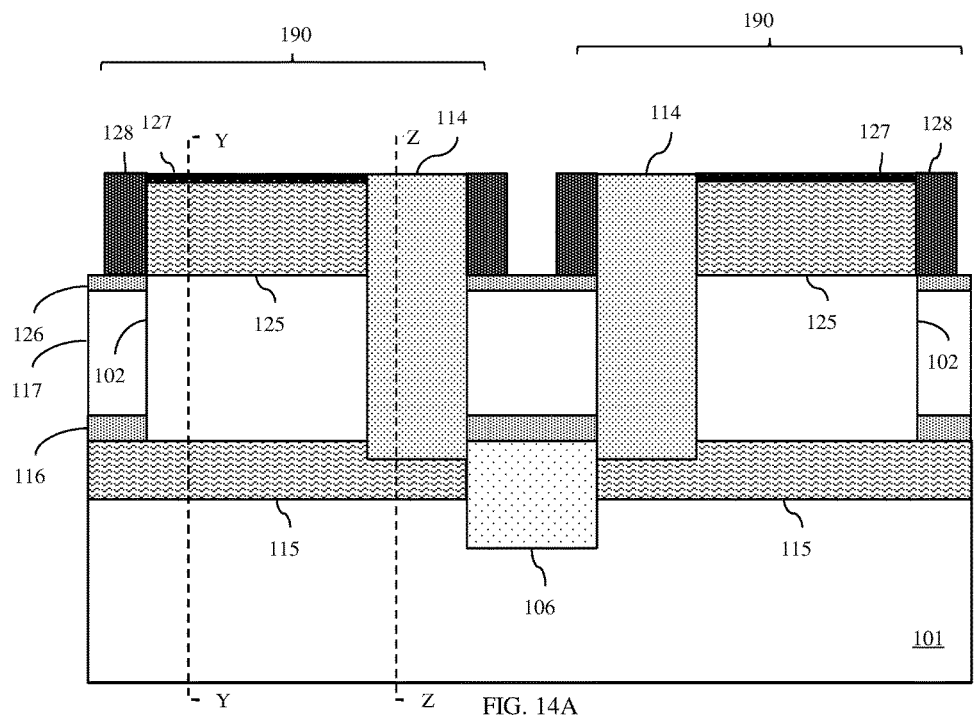
FIGS. 14A-14C are different cross section diagrams illustrating a partially completed structure formed according to the flow diagram of FIG. 3.
Figure 14B:
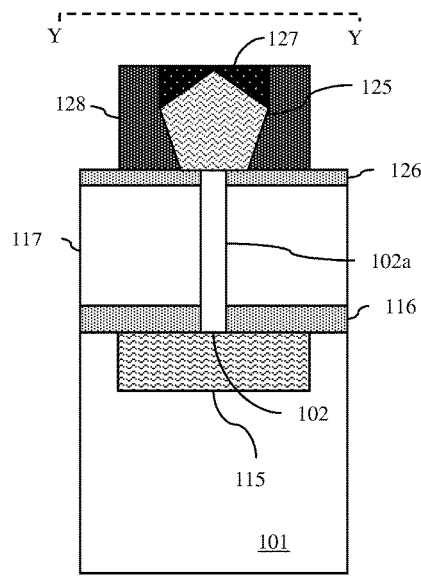
Figure 14C:
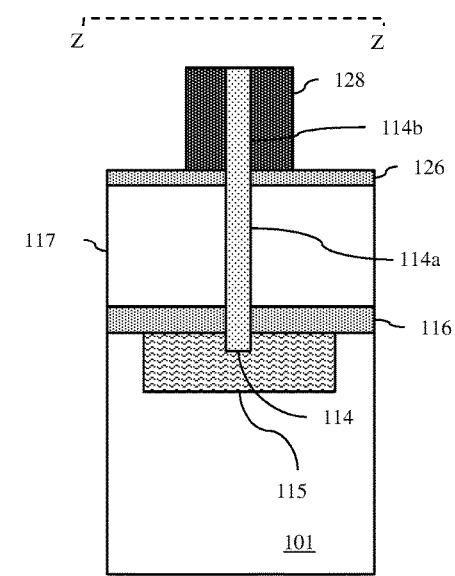

A first spacer layer 116 (also referred to herein as a lower spacer layer) can be deposited and recessed so as to cover exposed surfaces of the semiconductor substrate 101 and isolation region 106 and so as to laterally surround a bottom portion of each fin-shaped body (see process 320 and FIGS. 13A-13C). Next, a sacrificial gate 117 can be formed above the first spacer layer 116 so as to laterally surround each fin-shaped body (see process 322 and FIGS. 13A-13C). For example, a thin conformal dielectric layer can be deposited followed by deposition of a sacrificial gate layer (e.g., a polysilicon layer, amorphous silicon layer or any other suitable sacrificial material that can be selectively and isotropically etched away during subsequent processing). The sacrificial gate and conformal dielectric layers can be recessed so that the resulting sacrificial gate 117 is above the first spacer layer 116 and laterally surrounds each fin-shaped body. A second spacer layer 126 (also referred to herein as an upper spacer layer) can be deposited and recessed so as to cover the sacrificial gate 117 and also laterally surround an upper portion of each fin-shaped body (see process 324 and FIGS. 13A-13C).

Second S/D regions 125 (also referred to herein as upper S/D regions) can be formed above the second spacer layer 126 immediately adjacent to the tops of the semiconductor fins 102 (see process 326 and FIGS. 13A-13C). For example, an additional blanket sacrificial layer 124 (e.g., a silicon dioxide layer) can be deposited over the partially completed structure. S/D openings 123 can be formed (e.g., lithographically patterned and etched) in the sacrificial layer 124. The S/D openings 123 can be aligned above the semiconductor fins 102, can be wider than the semiconductor fins 102 and can extend, for example, to the second spacer layer 126, thereby exposing the upper portions of the semiconductor fins 102, respectively. Optionally, the semiconductor fins 102 can be recessed within the S/D openings (e.g., such that only the top surfaces of the semiconductor fins are exposed within the S/D openings 123). Then, an epitaxial semiconductor material can be grown on the tops of the semiconductor fins 102, thereby forming the second S/D regions 125 within the S/D openings 123. The epitaxial semiconductor material for each second S/D region of each VFET can be in situ doped so as to have the appropriate type conductivity at a relatively high conductivity level given the type of VFET being formed (e.g., N+ for an N-type VFET and P+ for a P-type VFET). Subsequently, protective dielectric caps 127 can be formed in the S/D openings to cover the top surfaces of the second S/D regions 125, the sacrificial layer 124 can be selectively removed and protective dielectric sidewall spacers 128 can be formed on the second spacer layer 126 laterally surrounding each second S/D region 125 and the upper portion 114b of the isolation fin 114 adjacent to the second S/D region 125 (see process 328 and FIGS. 13A-13C and 14A-14C).

It should be noted that the first spacer layer 116 and the second spacer layer 126 can be made of the same dielectric material or different dielectric materials (e.g., low-K dielectric material(s)), which are different from the first isolation material and the second isolation material. The protective dielectric sidewall spacers 128 can be made of a different dielectric material than the spacer layers and the protective dielectric caps 127 can be made of a different dielectric material than the protective dielectric sidewall spacers 128.

Figure 16A:
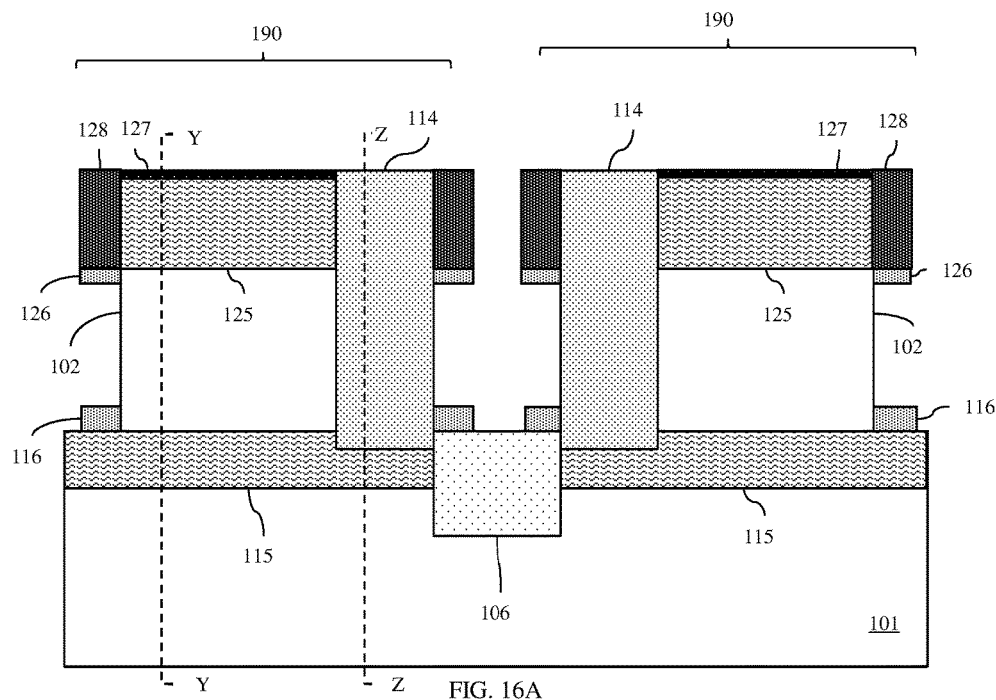
FIGS. 16A-16C are different cross section diagrams illustrating a partially completed structure formed according to the flow diagram of FIG. 3.
Figure 16B:
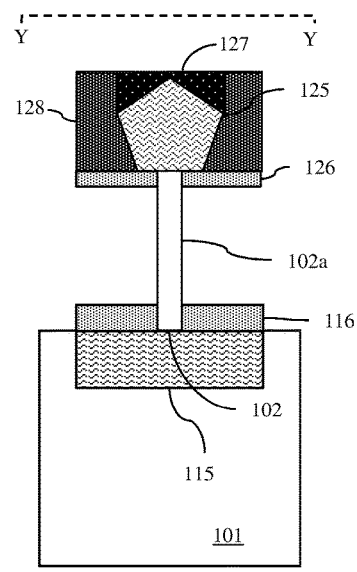
Figure 16C:
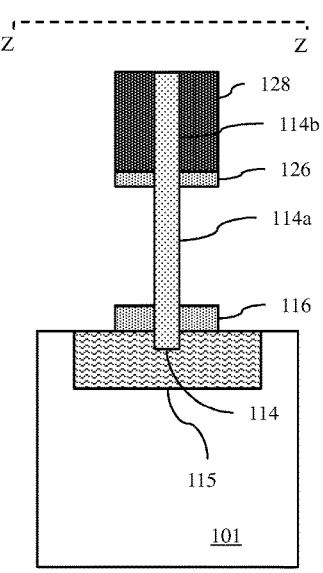

Next, using the combination of the protective dielectric cap 127 and protective dielectric sidewall spacer 128 around each second S/D region 125 as a mask pattern, an anisotropic etch process can be performed to pattern the second spacer layer 126 and the sacrificial gate 117 (see process 330 and FIGS. 15A-15C). The remaining portions of the sacrificial gate 117 can then be selectively removed (e.g., using a selective isotropic etch process), thereby creating cavities around the lower portions of each of the fin-shaped bodies between the first and second spacer layers (see process 332 and FIGS. 16A-16C). As illustrated, each cavity around each fin-shaped body exposes the first outer end and the first opposing sidewalls of the lower portion 102a of the semiconductor fin 102 and also exposes the second outer end and the second opposing sidewalls of the lower portion 114a of the adjacent isolation fin 114.

Figure 17A:
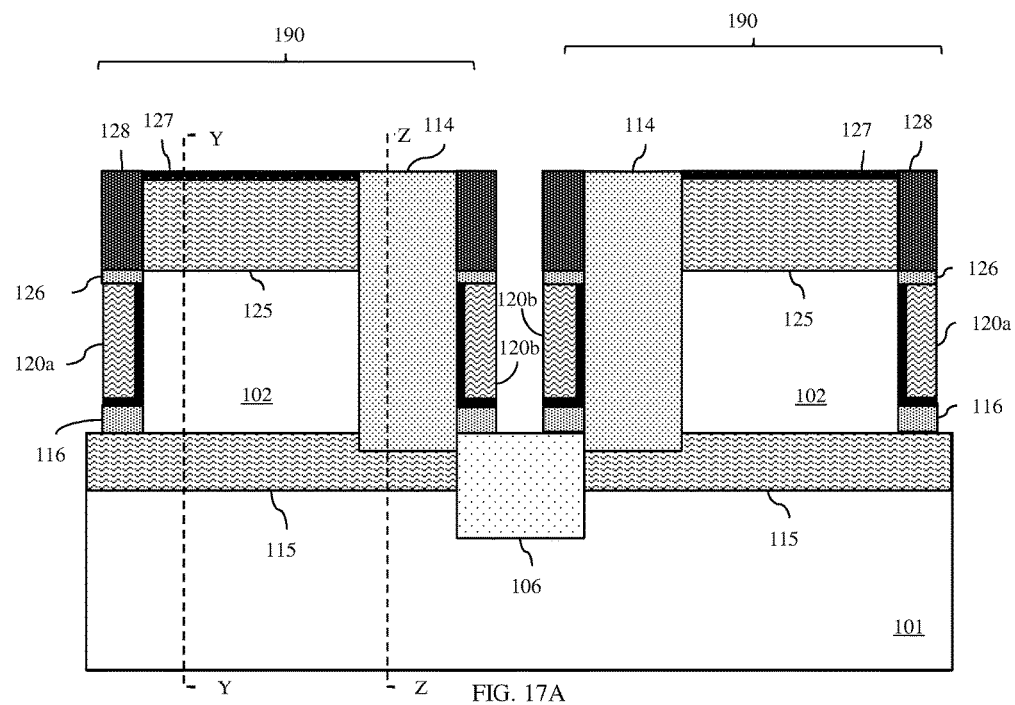
FIGS. 17A-17C are different cross section diagrams illustrating a partially completed structure formed according to the flow diagram of FIG. 3.
Figure 17B:
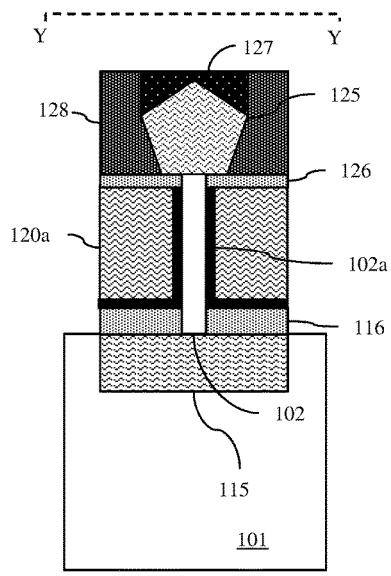
Figure 17C:
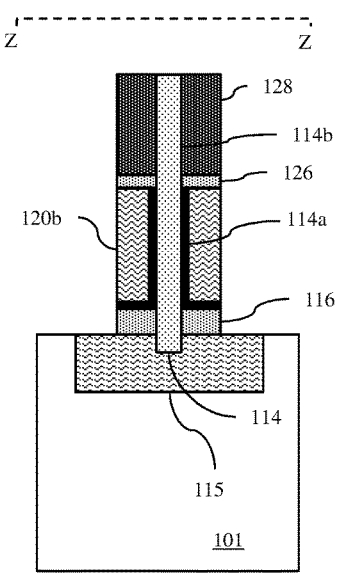

A replacement gate, such as a replacement metal gate (RMG), can then be formed within each cavity around each fin-shaped body. That is, a conformal gate dielectric layer can be deposited and a gate conductor layer can be deposited on the conformal gate dielectric layer (see process 334). Another anisotropic etch process can then be performed, again using the combination of the protective dielectric cap 127 and protective dielectric sidewall spacer 128 around each second S/D region 125 as a mask pattern, in order to pattern the gate conductor and gate dielectric layers (see process 336 and FIGS. 17A-17C). In the resulting structure, each gate has a main section 120a and an extension section 120b. The main section 120a is on the first spacer layer 116 above the substrate and is also positioned laterally immediately adjacent to the semiconductor fin 102 and, more particularly, is positioned laterally immediately adjacent to the first opposing sidewalls and further wraps around the first outer end of the semiconductor fin 102. The extension section 120b is also on the first spacer layer and is positioned laterally immediately adjacent to the isolation fin 114. Specifically, sides portions of the extension section 120b are on the first spacer layer above the substrate 101 and positioned laterally immediately adjacent to the second opposing sides of the lower portion 114a of the isolation fin 114 and an end portion of the extension section 120b wraps around the second outer end of the lower portion 114a of the isolation fin 114 such that an end portion of the extension section 120b is on the first spacer layer above the isolation region 106. Additionally, the upper portion 114b of the isolation fin 114 extends vertically above the level of the top surface of the extension section 120b.

Additional processing to complete the VFETs 190 can include, but is not limited to, the following (see process 338 and FIGS. 1A-1C). A first layer 151 of interlayer dielectric (ILD) material can be deposited and polished (e.g., using a CMP process) to expose the protective dielectric caps 127. The protective dielectric caps 127 can then be selectively removed. The dielectric material of the protective dielectric caps 127 should be different from the ILD material of the first layer 151 in order to allow for selective etching of the protective dielectric caps. In any case, a second layer 152 of ILD material can be deposited onto the second S/D regions 125 and the top surface of the first layer 151 of ILD material. The ILD material can be any of silicon dioxide, borophosphosilicate glass (BPSG), tetraethyl orthosilicate (TEOS), fluorinated tetraethyl orthosilicate (FTEOS), etc.

Contact openings to the S/D regions (not shown) and to the extension sections 120b of the gates can be formed (e.g., lithographically patterned and selectively and etched). Each gate contact opening can, for example, specifically be patterned and etched such that it extends through the second layer 152 of ILD material, lands on the second top surface of an isolation fin 114 and further extends essentially vertically down through the protective dielectric sidewall spacer 128 along the second opposing sidewalls and second outer end of the upper portion 114b of the isolation fin 114 to the top surface of the extension section 120b. Contacts, including S/D contacts (not shown) and gate contacts 130, can then be formed in the gate contact openings. Techniques for forming contacts in contact openings are well known in the art and, thus, the details of these techniques have been omitted from the specification in order to allow the reader to focus on the salient aspects of the disclosed methods.

Figure 18:
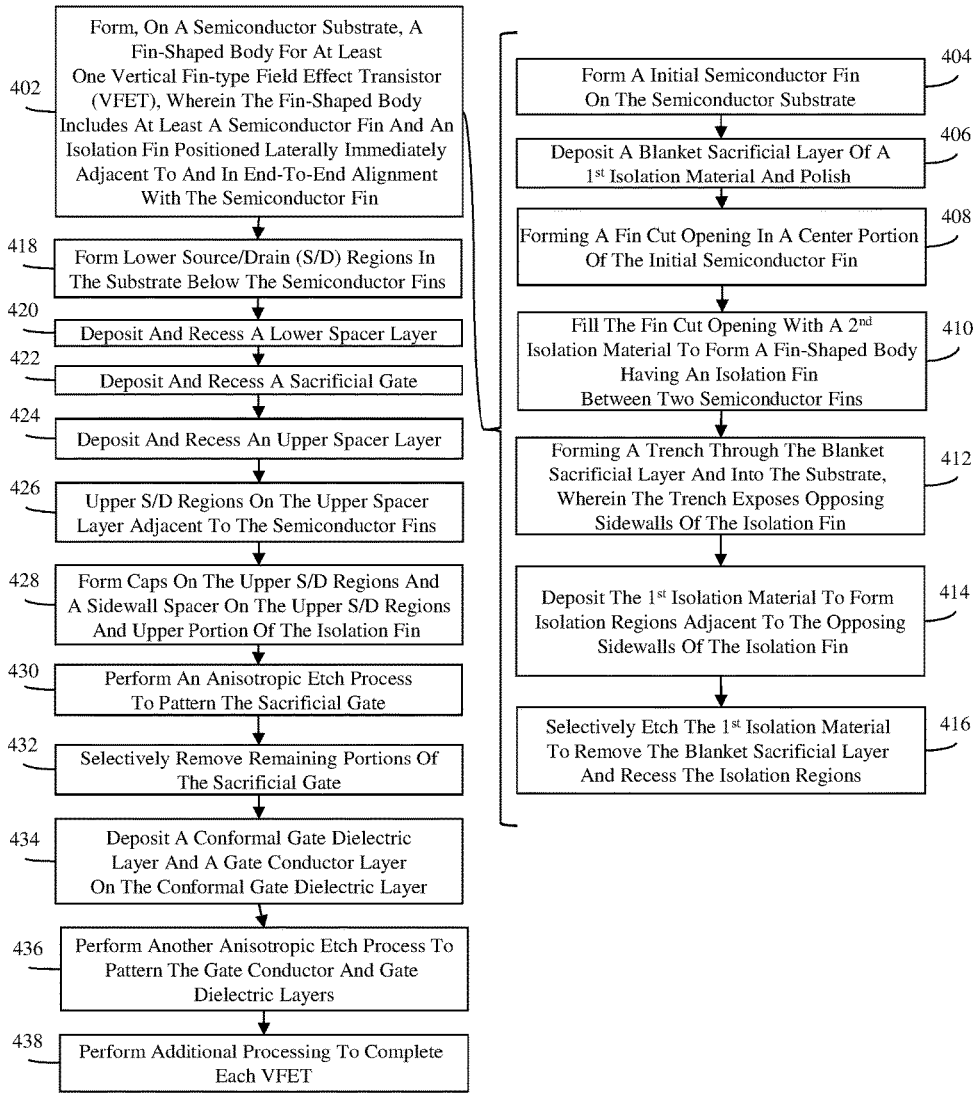
FIG. 18 is a flow diagram illustrating a method of forming the semiconductor structure of FIGS. 2A-2D.

Referring to the flow diagram of FIG. 18, also disclosed are embodiments of a method of forming the semiconductor structure of FIGS. 2A-2D. This method embodiment can similarly include providing a substrate 201. The substrate 201 can be a bulk semiconductor substrate (e.g., a bulk silicon substrate). Alternatively, the substrate 201 can be a semiconductor layer above an insulator layer of a semiconductor-on-insulator wafer (e.g., a silicon layer above a buried oxide layer of a silicon-on-insulator (SOI) wafer).

Optionally, the semiconductor substrate 201 can include, for a pair of VFETs 290, first source/drain (S/D) regions (also referred to herein as a lower S/D region, not shown), which were previously formed at some predetermined depth below the top surface of the substrate 201. The VFETs 290 being formed according to the method can have the same type conductivity or different type conductivities. Thus, the first source/drain (S/D) region for each VFET 290 can have the appropriate type conductivity at a relatively high conductivity level, given the type of VFET being formed (e.g., N+ for an N-type VFET or P+ for a P-type VFETs). Such first S/D regions could be formed, for example, by performing a masked dopant implantation process to form deep well regions below the top surface of the semiconductor substrate in different VFET regions. Alternatively, any other suitable technique could be used to form such first source/drain regions. For example, the semiconductor substrate 201 can include multiple semiconductor layers and, particularly, a first semiconductor layer with trenches filled with epitaxial semiconductor material (i.e., first source/drain regions) and a second semiconductor layer on the first semiconductor layer and extending laterally over the first source/drain regions. The epitaxial semiconductor material of the first source/drain regions can be the same or different than that of the semiconductor substrate 201.

Figure 19A:
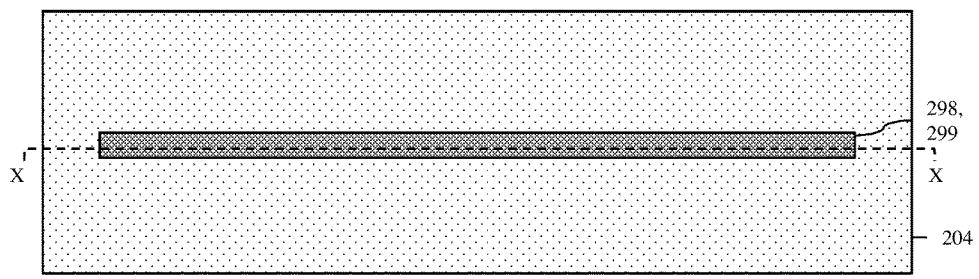
FIGS. 19A and 19B are top view and cross section diagrams, respectively, illustrating a partially completed structure formed according to the flow diagram of FIG. 18.
Figure 19B:
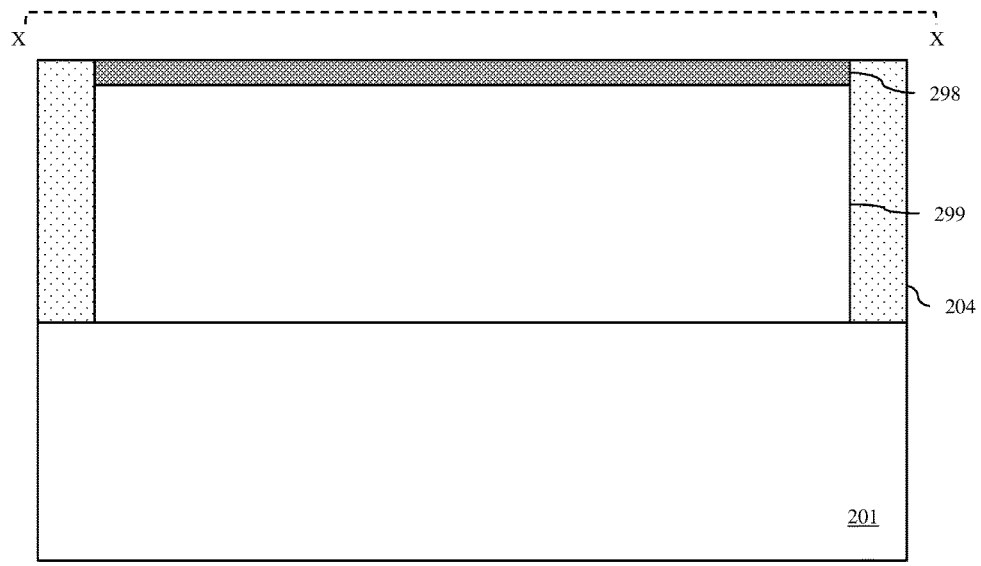

One or more fin-shaped bodies, which include two semiconductor fins and an isolation fin between the semiconductor fins, can be formed on the semiconductor substrate 201 (see process 402). To form such a fin-shaped body, an initial semiconductor fin 299 with a dielectric cap 298 (e.g., a silicon nitride cap) can first be formed on the semiconductor substrate 201 (see process 404 and FIGS. 19A-19B). For example, this initial semiconductor fin 299 with the dielectric cap 298 can be patterned and etched into the upper portion of the semiconductor substrate. Techniques for patterning semiconductor fins (e.g., conventional lithographic patterning techniques, sidewall image transfer patterning techniques, etc.) are well known in the art and, thus, the details have been omitted from the specification in order to allow the reader to focus on the salient aspects of the disclosed embodiments.

A blanket sacrificial layer 204 can then be deposited onto the semiconductor substrate 201 and over the initial semiconductor fin 299 with the dielectric cap 298. The blanket sacrificial layer 204 can be made of a first isolation material (e.g., silicon dioxide or some other suitable isolation material) (see process 406 and FIGS. 19A-19B). The blanket sacrificial layer 204 can be polished (e.g., using a chemical mechanical polishing (CMP) process) to expose the top of the dielectric cap 298.

Figure 20A:
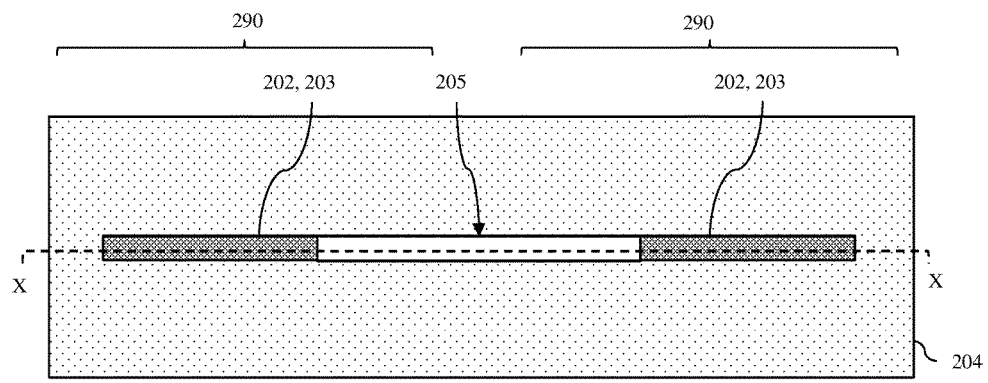
FIGS. 20A and 20B are top view and cross section diagrams, respectively, illustrating a partially completed structure formed according to the flow diagram of FIG. 18.
Figure 20B:
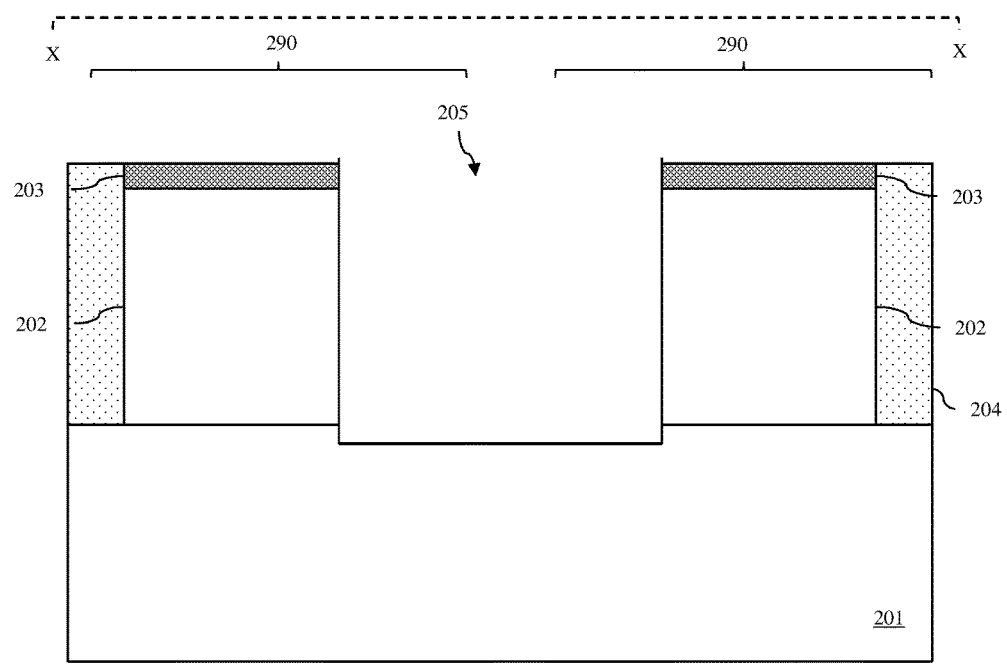

A fin cut opening 205 can subsequently be formed (e.g., lithographically patterned and selectively etched) so that it extends essentially vertically through the dielectric cap 298 and initial semiconductor fin 299 and into the substrate 201, thereby completely removing a center portion of the initial semiconductor fin 299 and dividing it into two semiconductor fins 202 (i.e., a semiconductor fin and an additional semiconductor fin) with corresponding dielectric caps 203 (see process 408 and FIGS. 20A-20B). As discussed in greater detail below, the two semiconductor fins 202 can be used to form two adjacent vertical field effect transistor (VFETs) 290, respectively, that are essentially mirror images of each other. In this embodiment, the dielectric material of the dielectric cap 298 can be different from the first isolation material of the blanket sacrificial layer 204 and the process used to form the fin cut opening 205 can be a selective anisotropic etch process that etches exposed portions of the dielectric cap and semiconductor fin without also etching the blanket sacrificial layer 204.

It should be noted that, if first S/D regions for the VFETs 290 were previously formed, processes 402-408 should be performed such that the semiconductor fins 202 are above and immediately adjacent to the first S/D regions. It should also be noted that each semiconductor fin 202 for each VFET 290 can either be undoped or, at some point during processing before or after formation, doped so as to have the appropriate type conductivity at a relatively low conductivity level given the type of VFET being formed (e.g., P- for an N-type VFET and N- for a P-type VFET).

Figure 21A:
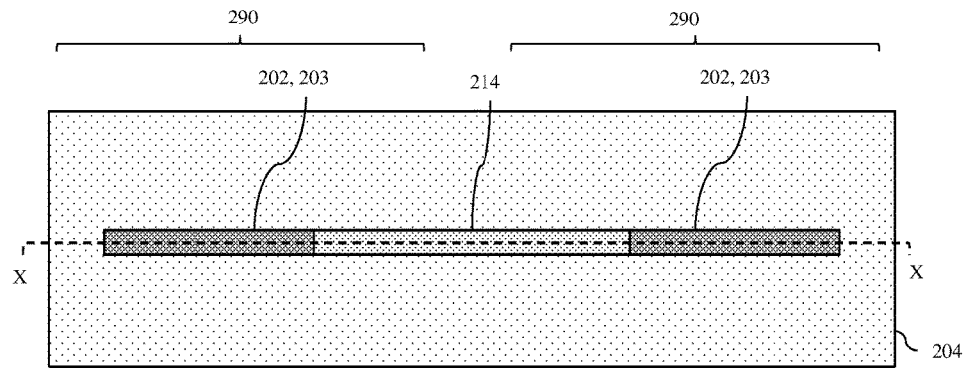
FIGS. 21A and 21B are top view and cross section diagrams, respectively, illustrating a partially completed structure formed according to the flow diagram of FIG. 18.
Figure 21B:
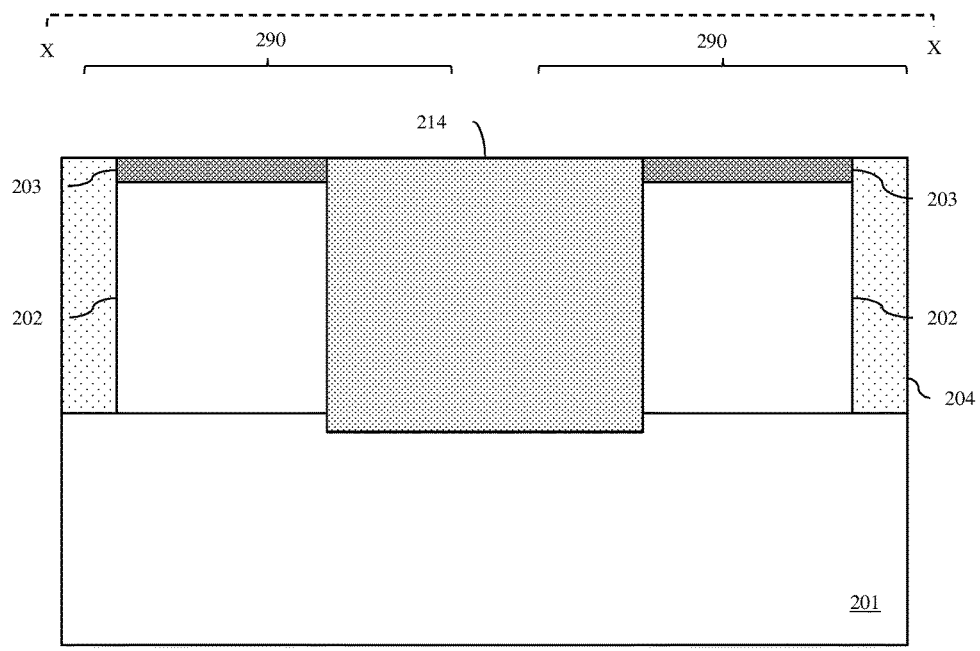

A layer of a second isolation material can be deposited so as to fill the fin cut opening 205 and, then, polished (e.g., using a CMP process) so as to form an isolation fin 214 positioned laterally between the two semiconductor fins 202 (see process 410 and FIGS. 21A-21B). In other words, the center portion of the initial semiconductor fin is replaced by an isolation fin 214. The second isolation material can be different from the first isolation material and also different from the dielectric material of the dielectric cap 298. The second isolation material can be silicon nitride or any other suitable isolation material. For example, the second isolation material can be a low-K dielectric material. Those skilled in the art will recognize that a low-K dielectric material is a dielectric material having a dielectric constant that is lower than the dielectric constant of silicon dioxide and, particularly, that is lower than 3.9. Exemplary isolation materials that can be used for the second isolation material of the isolation fin 214 can include, but are not limited to, silicon nitride (SiN), silicon oxynitride (SiON), carbon-doped silicon oxynitride (SiONC), carbon-doped silicon (SiC), silicon carbon nitride (SiCN), silicon oxycarbide (SiCO), hydrogenated silicon oxycarbide (SiCOH), etc.

Following process 410, each semiconductor fin 202 will have an outer end, an inner end opposite the outer end and first opposing sidewalls. Additionally, the isolation fin 214 will have opposing ends that abut the inner ends of the two semiconductor fins 202 and second opposing sidewalls. Thus, the isolation fin 214 is positioned laterally immediately adjacent to, between, and in end-to-end alignment with the semiconductor fins 202.

Figure 22:
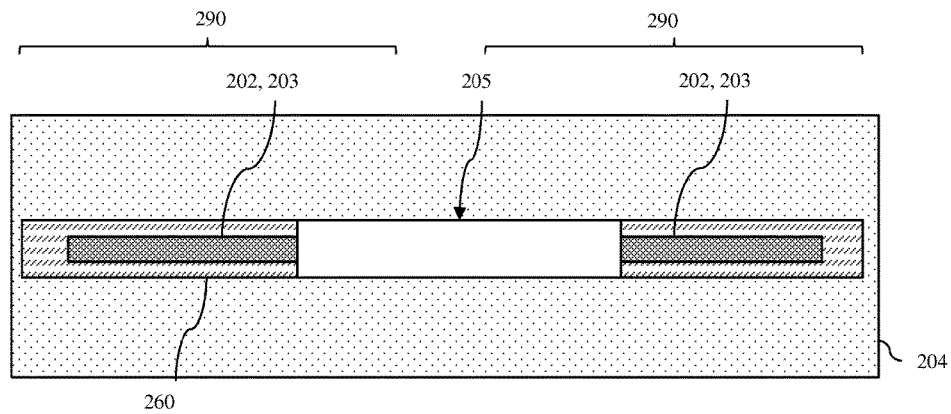
FIGS. 22 and 23 are cross section diagrams illustrating alternative process steps.
Figure 23:
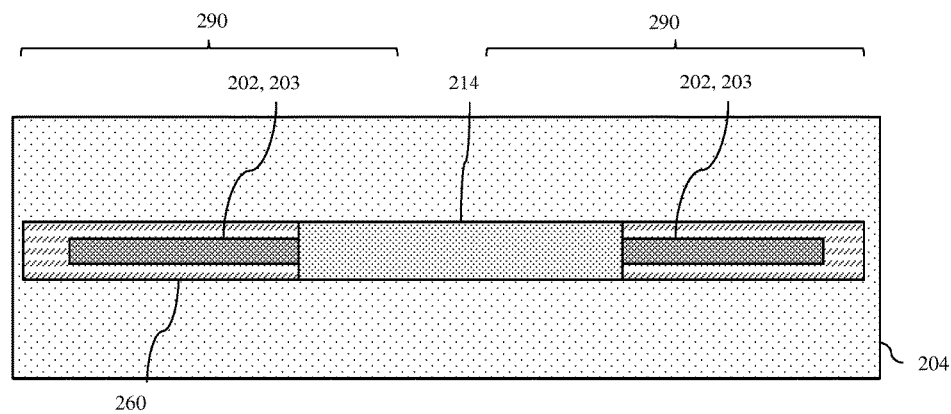

Additionally, as illustrated the processes described above will result in the isolation fin 214 having essentially the same width as the adjacent semiconductor fins 202. However, alternatively, before depositing the blanket sacrificial layer 204, a sacrificial sidewall spacer 260 could be formed. In this case, the fin cut opening 205 can cut through the center portion of the initial semiconductor fin 299 and also the adjacent sidewall spacer material such that the fin cut opening 205 is wider than the resulting semiconductor fins 202 (as shown in FIG. 22). Then, when the fin cut opening is filled, the resulting isolation fin 214 will also be wider than the semiconductor fins 202 (see FIG. 23).

Figure 24A:
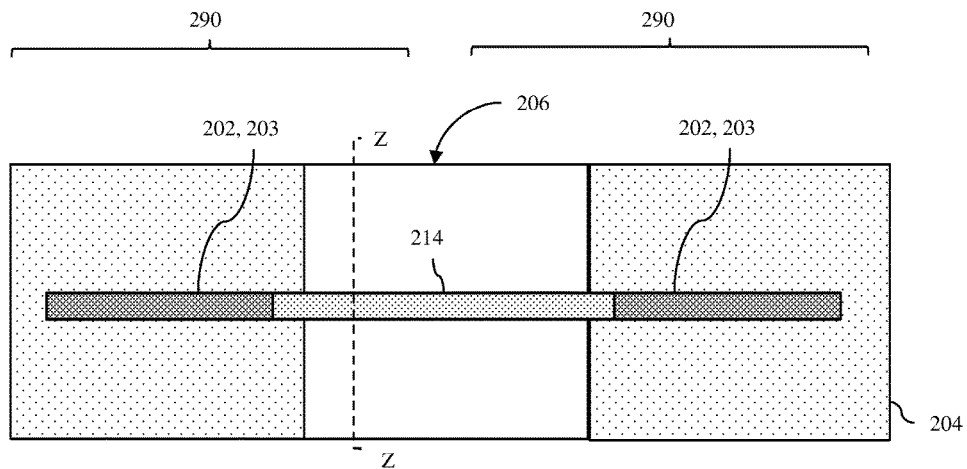
FIGS. 24A and 24B are top view and cross section diagrams, respectively, illustrating a partially completed structure formed according to the flow diagram of FIG. 18.
Figure 24B:
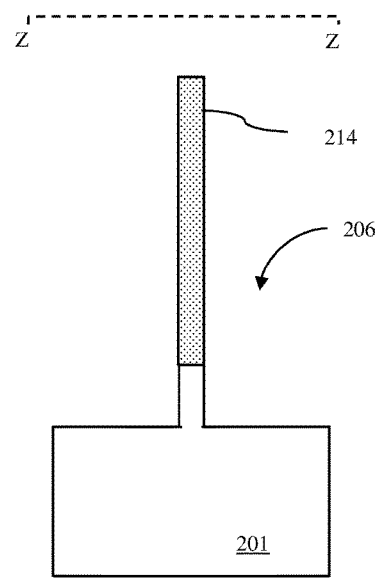
Figure 25A:
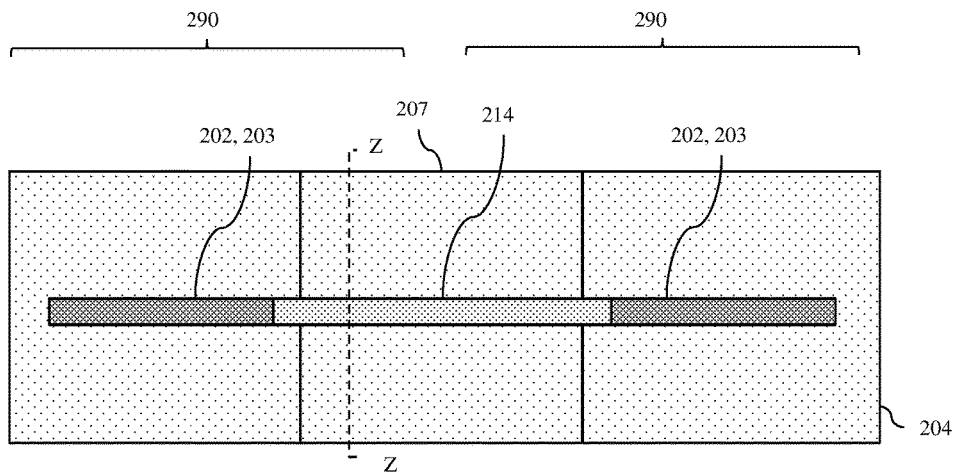
FIGS. 25A and 25B are top view and cross section diagrams, respectively, illustrating a partially completed structure formed according to the flow diagram of FIG. 18.
Figure 25B:
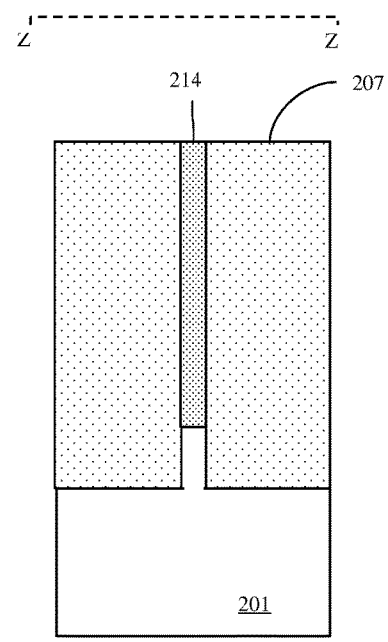
Figure 26A:
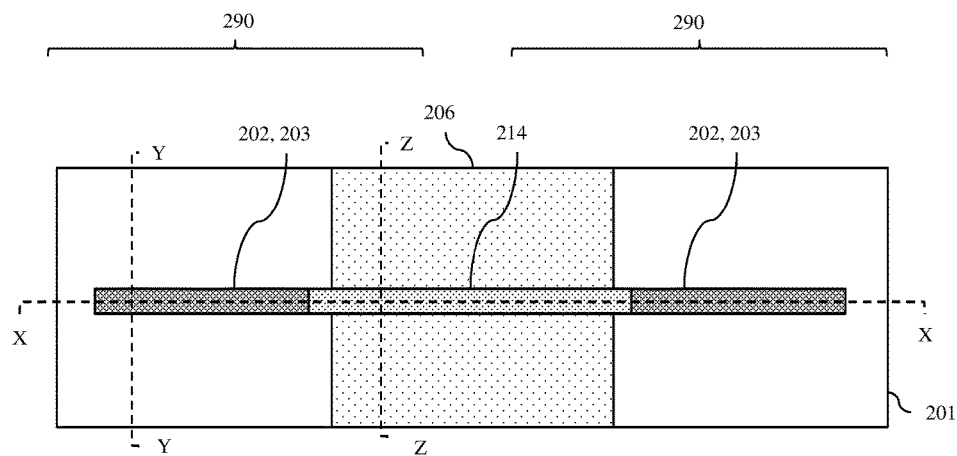
FIG. 26A is a top view diagram and FIGS. 26B-26D are cross section diagrams illustrating a partially completed structure formed according to the flow diagram of FIG. 18.
Figure 26B:
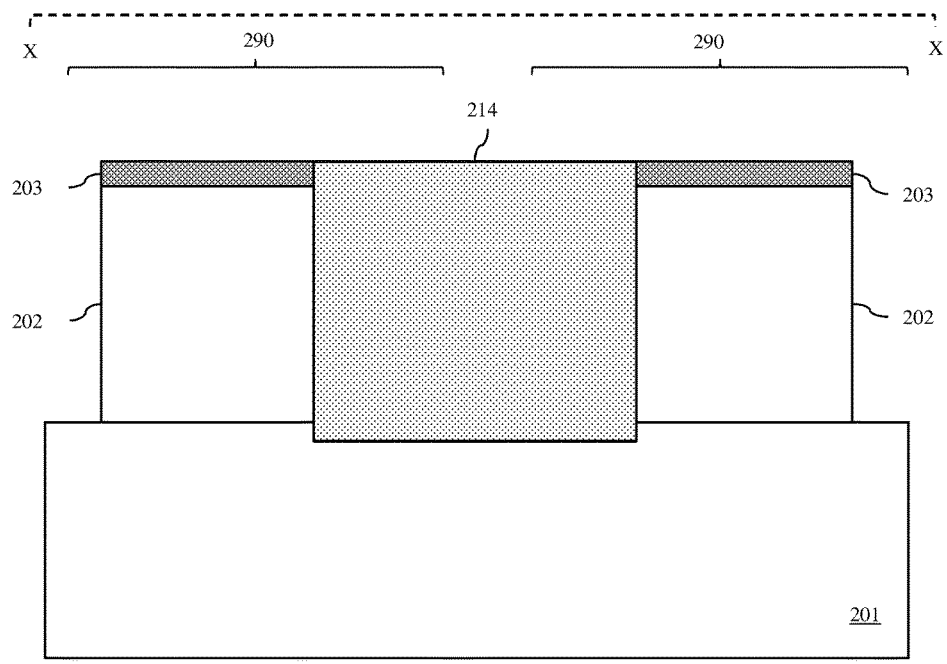
Figure 26C:
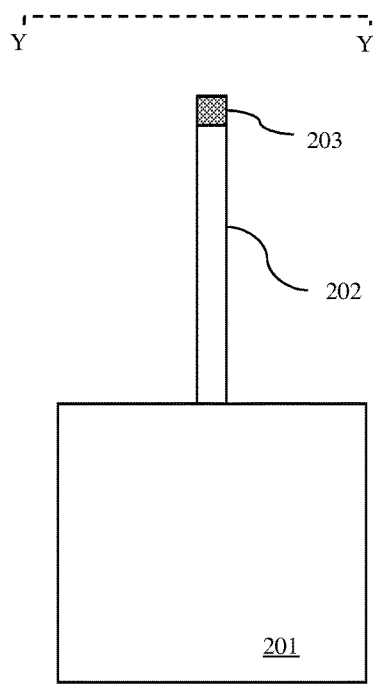
Figure 26D:
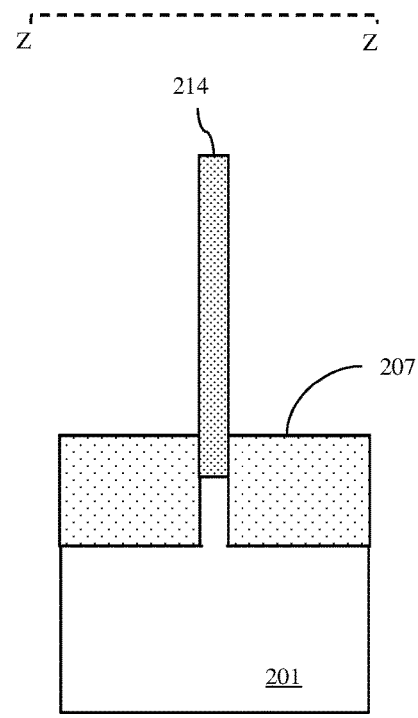

Next, a trench 206 can be formed through the blanket sacrificial layer 204 and into the semiconductor substrate 201 such that, within the trench 206, the second opposing sidewalls of the isolation fin 214 are exposed (see process 412 and FIGS. 24A-24B). The first isolation material can then be deposited and polished (e.g., using a CMP process) to form isolation regions 207, which are positioned laterally adjacent to the second opposing sidewalls of the isolation fin 214 (see process 414 and FIGS. 25A-25B). It should be noted that the depth of the trench 206 formed at process 414 can be greater than the depth of the fin cut opening 205 formed at process 410 such that the bottom surfaces of the isolation regions 207 within the substrate 201 are below the level of the bottom surface of the isolation fin 214.

Next, the first isolation material can be selectively and anisotropically etched back in order to completely remove the blank sacrificial layer 204 and also recess the top surfaces of the isolation regions 206 to a level that is at or below the top surface of the semiconductor substrate 201 (see process 416 and FIGS. 26A-26D). This etch process will expose the top surface of the semiconductor substrate 201, the outer ends and first opposing sidewalls of the semiconductor fins 202 and the second opposing sidewalls of the isolation fin 214. The sacrificial sidewall spacer 260, if present, would also be selectively removed at this time.

Figure 27A:
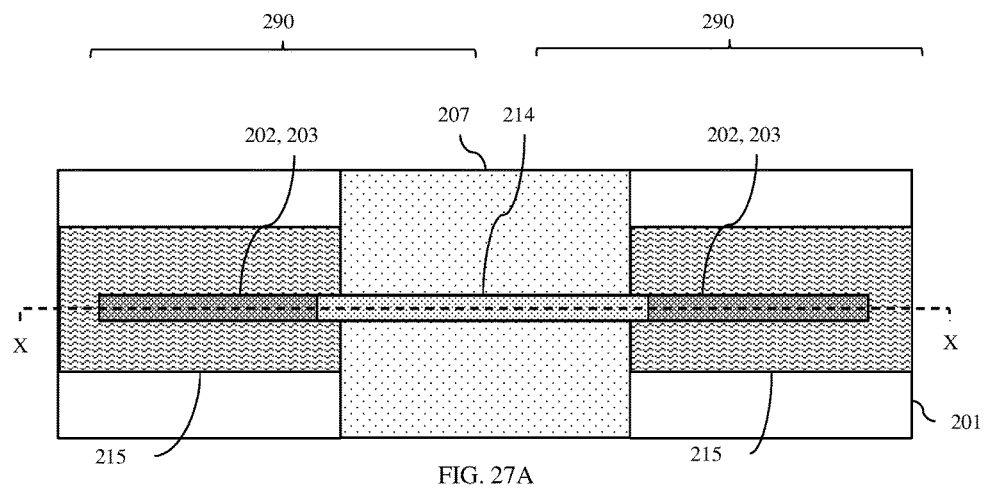
FIGS. 27A and 27B are top view and cross section diagrams, respectively, illustrating a partially completed structure formed according to the flow diagram of FIG. 18.
Figure 27B:
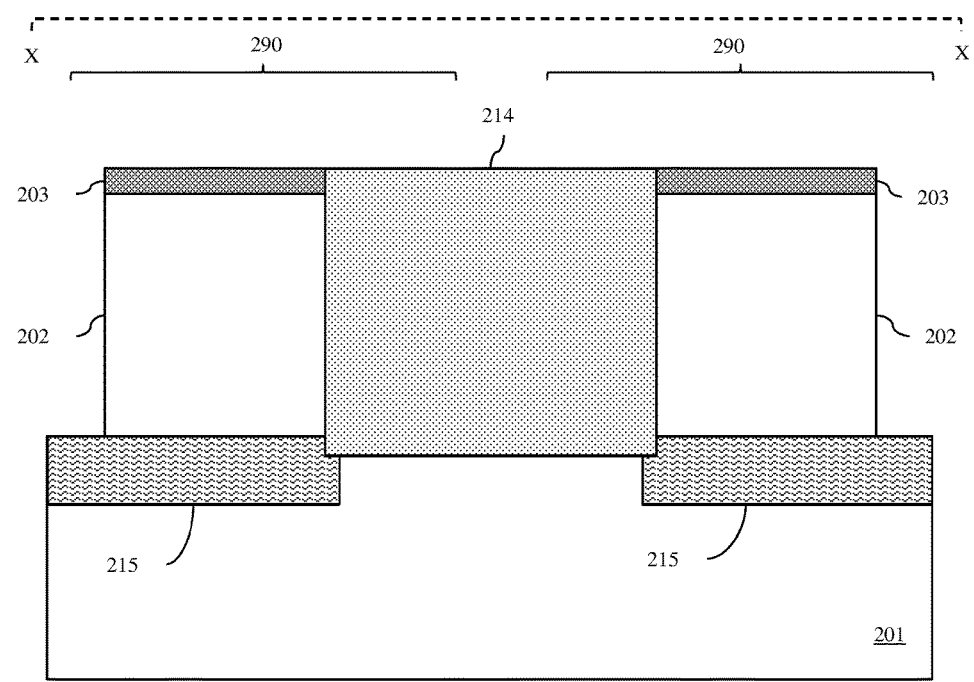

If the first source/drain regions for the VFETs 290 were not previously formed, as discussed above, they can now be formed in the semiconductor substrate 201 immediately adjacent to the bottoms of the semiconductor fins 202 (see process 418 and FIGS. 27A-27B). The first source/drain regions 215 can be formed, for example, as dopant implant regions, doped epitaxial semiconductor regions, etc. Various different techniques for forming such source/drain regions for VFETs are well known in the art and, thus, the details have been omitted from this specification in order to allow the reader to focus on the salient aspects of the disclosed methods. As mentioned above, the first S/D region 215 of each VFET 290 can be doped so as to have an appropriate type conductivity at a relatively high conductivity level, given the type of VFET being formed (e.g., N+ for an N-type VFET or P+ for a P-type VFET).

Additional processing can be performed in order to complete each of the VFETs 290. This additional processing can include, but is not limited to, formation of second S/D regions (also referred to as upper S/D regions) for the VFETs 290, formation of self-aligned gates for the VFETs 290, formation of gate contacts for the VFETs 290, etc. Those skilled in the art will recognize that various techniques for forming these features are well known in the art. However, with any of these techniques, the inclusion of the isolation fin 214 within the fin-shaped body will ensure that the gate formation process results, not just in a self-aligned gate adjacent to the semiconductor fins, but in a combined gate/gate extension structure that is self-aligned.

The following exemplary processes for completing the VFETs 290 are offered for illustration purposes and are not intended to be limiting. Alternatively, any other suitable processes could be performed to complete the VFETs 290.

Figure 28A:
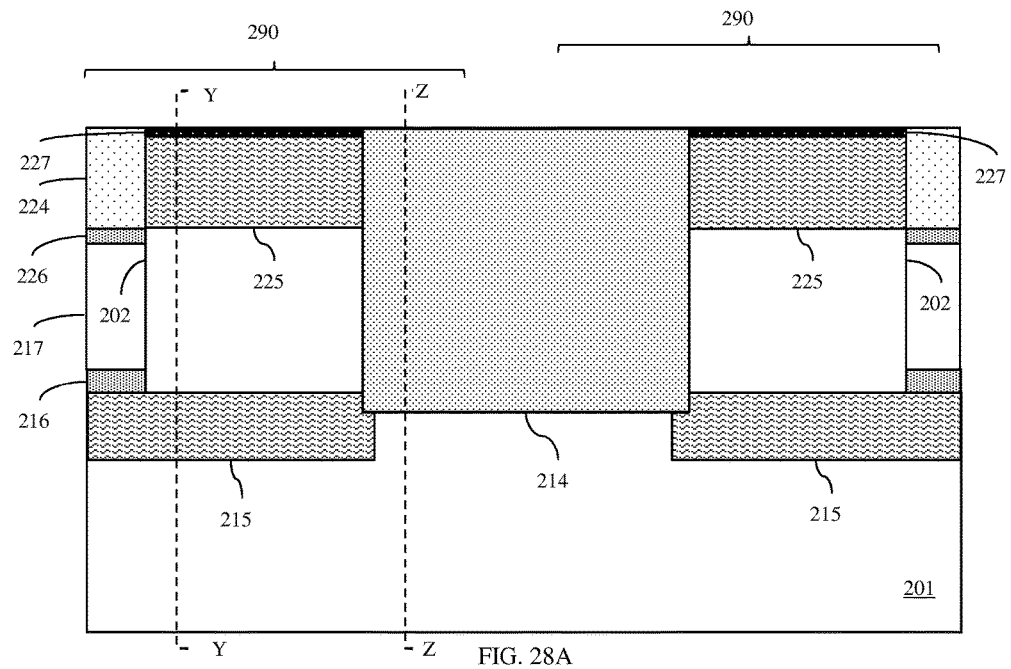
FIGS. 28A-28C are different cross section diagrams illustrating a partially completed structure formed according to the flow diagram of FIG. 18.
Figure 28B:
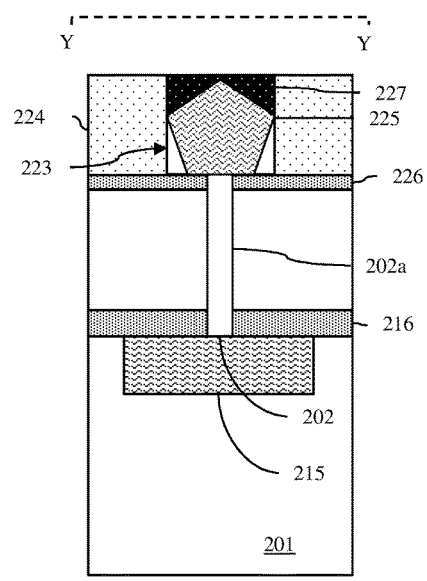
Figure 28C:
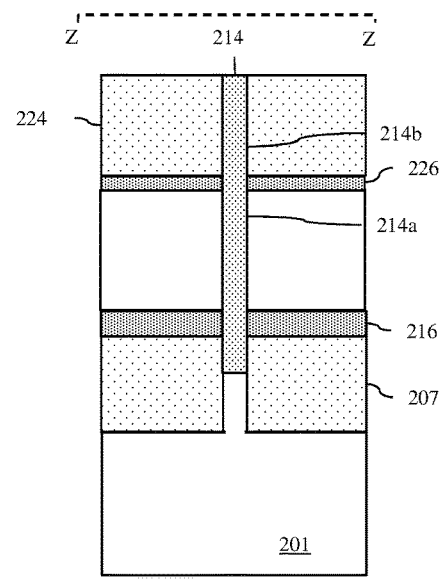
Figure 29A:
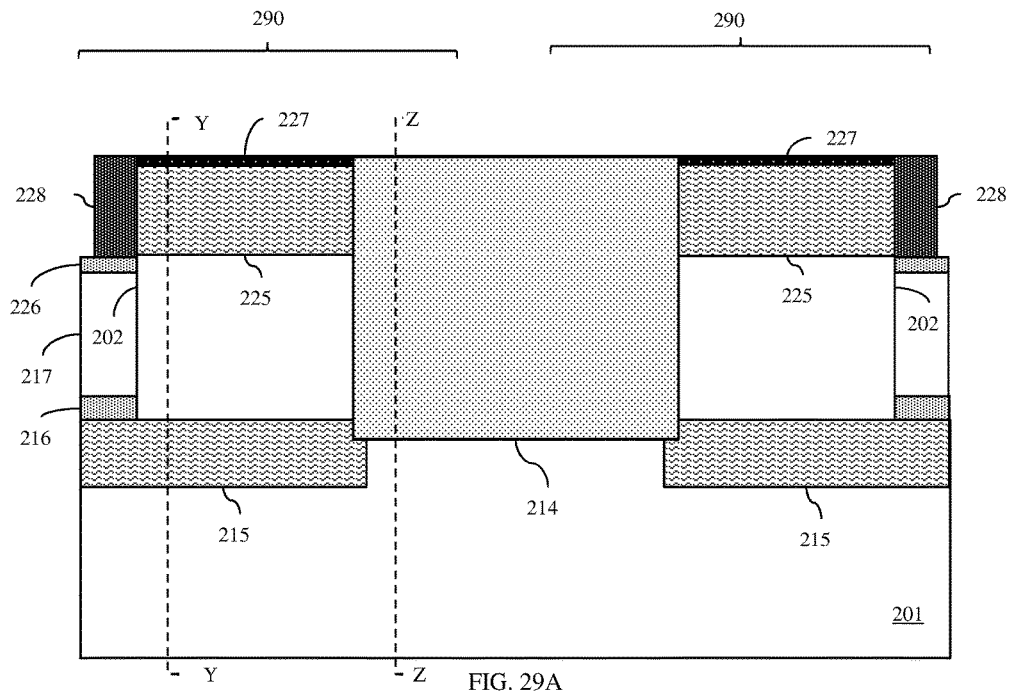
FIGS. 29A-29C are different cross section diagrams illustrating a partially completed structure formed according to the flow diagram of FIG. 18.
Figure 29B:
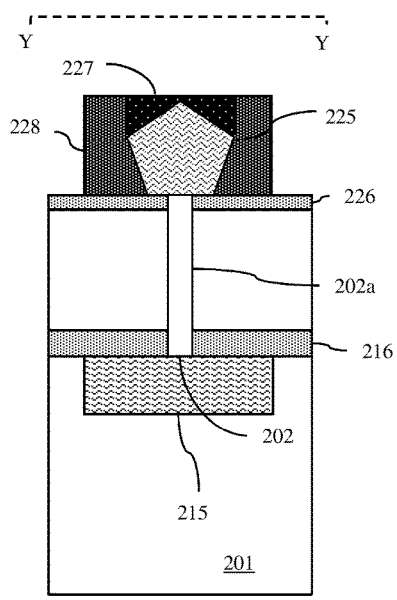
Figure 29C:
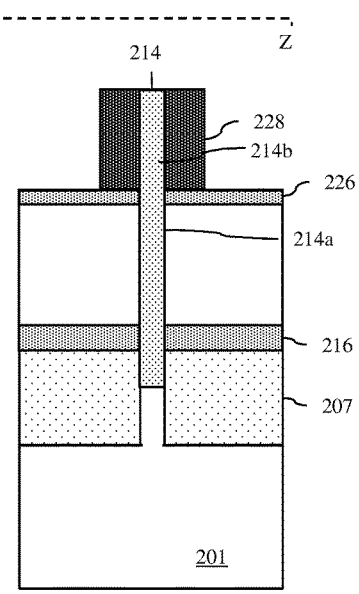

A first spacer layer 216 (also referred to herein as a lower spacer layer) can be deposited and recessed so as to cover exposed surfaces of the semiconductor substrate 201 and isolation regions 207 and so as to laterally surround a bottom portion of the entire fin-shaped body (see process 420 and FIGS. 28A-28C). Next, a sacrificial gate 217 can be formed above the first spacer layer 216 so as to laterally surround the fin-shaped body (see process 422 and FIGS. 28A-28C). For example, a thin conformal dielectric layer can be deposited followed by deposition of a sacrificial gate layer (e.g., a polysilicon layer, an amorphous silicon layer, or any other suitable sacrificial material that can be selectively and isotropically etched away during subsequent processing). The sacrificial gate and conformal dielectric layers can be recessed so that the resulting sacrificial gate 217 is above the first spacer layer 216 and laterally surrounds the fin-shaped body. A second spacer layer 226 (also referred to herein as an upper spacer layer) can be deposited and recessed so as to cover the sacrificial gate 217 and also laterally surround an upper portion of the fin-shaped body (see process 424 and FIGS. 28A-28C).

Second S/D regions 225 (also referred to herein as upper S/D regions) can be formed above the second spacer layer 226 immediately adjacent to the tops of the semiconductor fins 202 (see process 426 and FIGS. 28A-28C). For example, an additional blanket sacrificial layer 224 (e.g., a silicon dioxide layer) can be deposited over the partially completed structure. S/D openings 223 can be formed (e.g., lithographically patterned and etched) in the sacrificial layer 224. The S/D openings 223 can be aligned above the semiconductor fins 202, can be wider than the semiconductor fins 202 and can extend essentially vertically to the second spacer layer 226, thereby exposing the upper portions of the semiconductor fins 202, respectively. Optionally, the semiconductor fins 202 can be recessed within the S/D openings (e.g., such that only the top surfaces of the semiconductor fins are exposed within the S/D openings 223). Then, an epitaxial semiconductor material can be grown on the tops of the semiconductor fins 202, thereby forming the second S/D regions 225 within the S/D openings 223. The epitaxial semiconductor material for each second S/D region of each VFET can be in situ doped so as to have the appropriate type conductivity at a relatively high conductivity level given the type of VFET being formed (e.g., N+ for an N-type VFET and P+ for a P-type VFET). Subsequently, protective dielectric caps 227 can be formed in the S/D openings to cover the top surfaces of the second S/D regions 225, the sacrificial layer 224 can be selectively removed and a protective dielectric sidewall spacer 228 can be formed on the second spacer layer 226 around around the second S/D regions and the upper portion 214b of the isolation fin 214 (see process 428 and FIGS. 28A-28C and 29A-29C).

It should be noted that the first spacer layer 216 and the second spacer layer 226 can be made of the same dielectric material or different dielectric materials (e.g., low-K dielectric material(s)), which are different from the first isolation material and the second isolation material. The protective dielectric sidewall spacer 228 can be made of a different dielectric material than the spacer layers and the protective dielectric caps 227 can be made of a different dielectric material than the protective dielectric sidewall spacer 228.

Figure 30A:
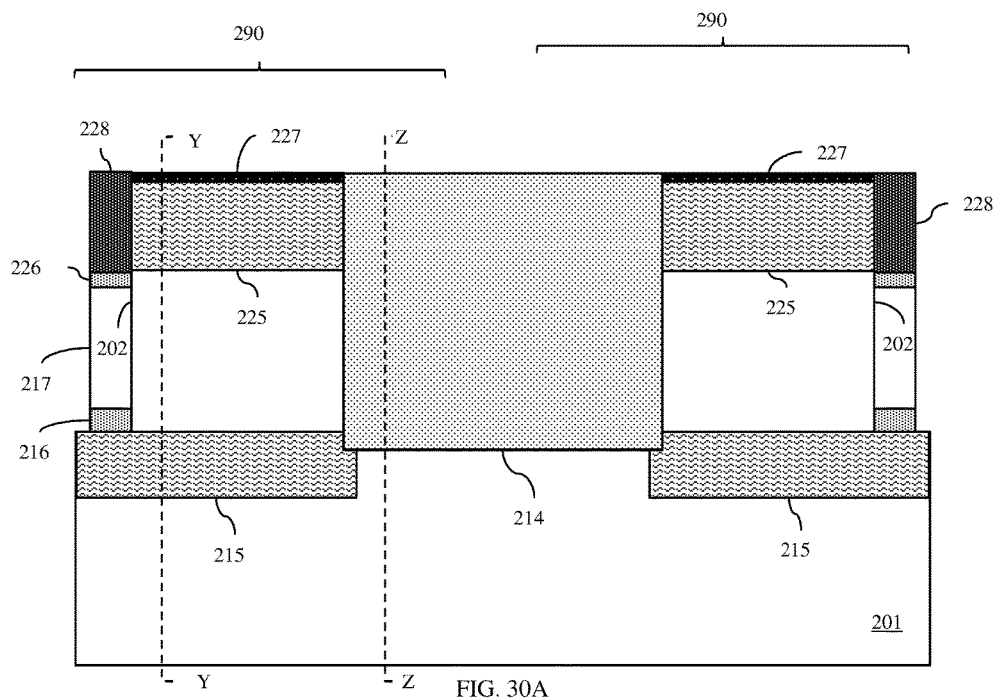
FIGS. 30A-30C are different cross section diagrams illustrating a partially completed structure formed according to the flow diagram of FIG. 18.
Figure 30B:
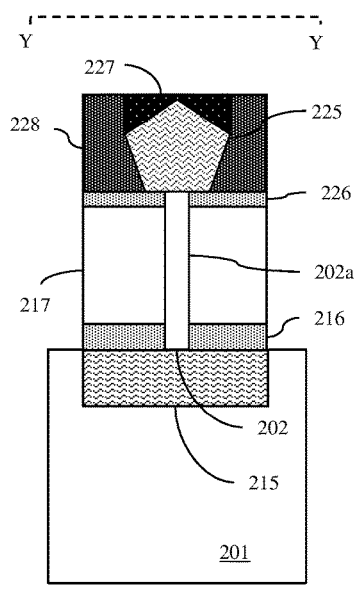
Figure 30C:
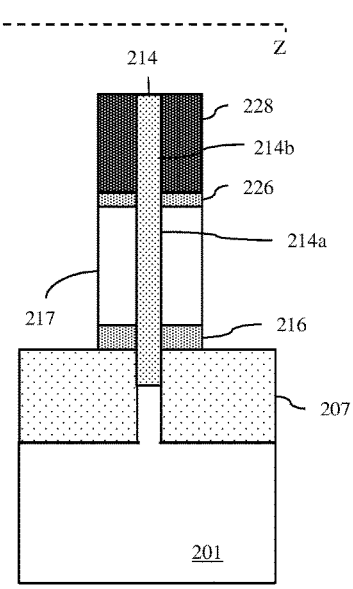
Figure 31A:
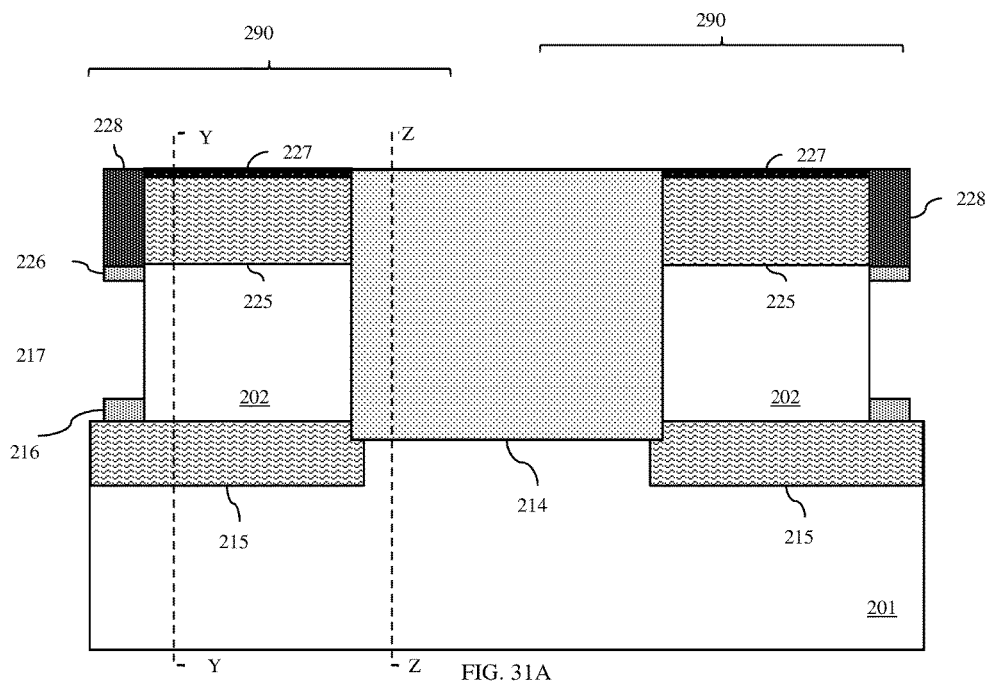
FIGS. 31A-31C are different cross section diagrams illustrating a partially completed structure formed according to the flow diagram of FIG. 18.
Figure 31B:
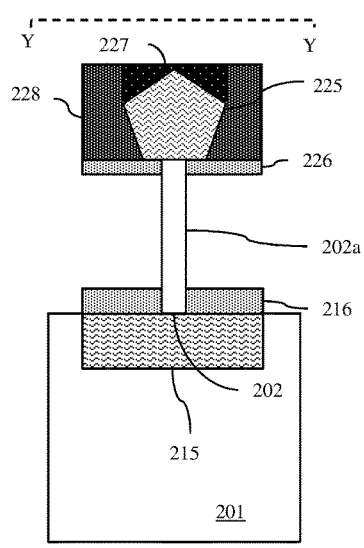
Figure 31C:
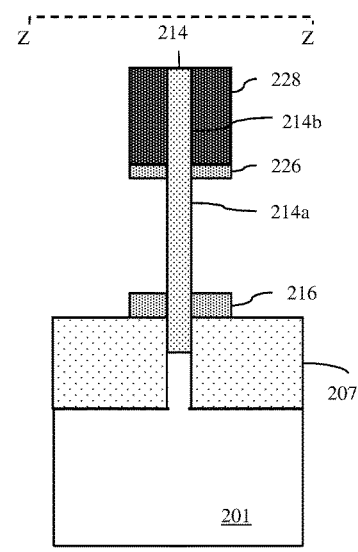

Next, using the combination of the protective dielectric cap 227 and dielectric sidewall spacer 228 as a mask pattern, an anisotropic etch process can be performed to pattern the second spacer layer 226 and the sacrificial gate 217 (see process 430 and FIGS. 30A-30C). Then, the remaining portions of the sacrificial gate 217 can be selectively removed (e.g., using a selective isotropic etch process), thereby creating a cavity around the lower portion of the fin-shaped body between the first and second spacer layers (see process 432 and FIGS. 31A-31C). As illustrated, within the cavity, the outer ends and the first opposing sidewalls of the lower portion 202a of each semiconductor fin 202 are exposed and the second opposing sidewalls of the lower portion 214a of the isolation fin 214 are also exposed.

Figure 32A:
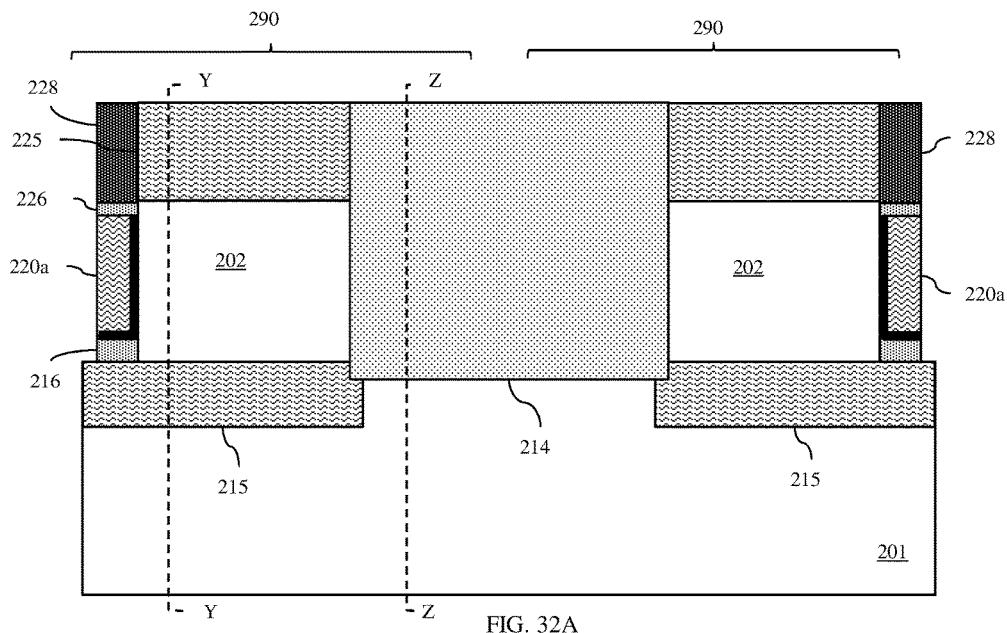
FIGS. 32A-32C are different cross section diagrams illustrating a partially completed structure formed according to the flow diagram of FIG. 3.
Figure 32B:
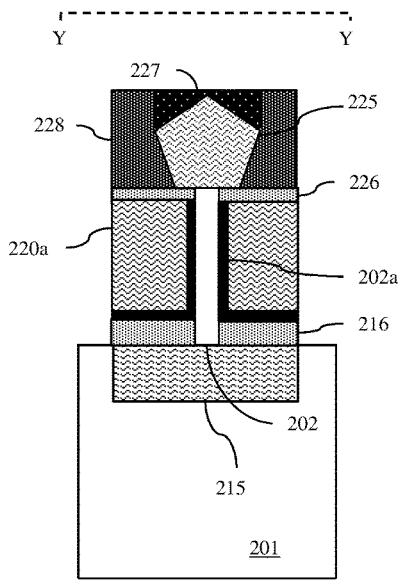
Figure 32C:
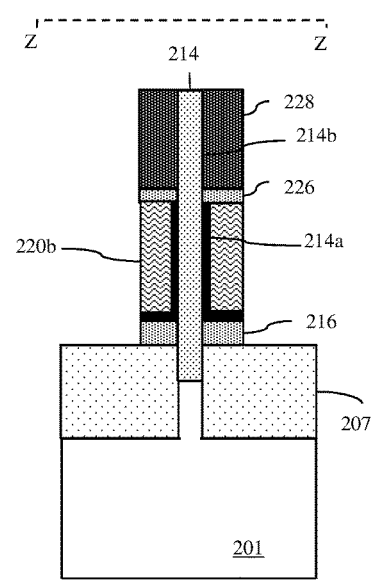

A replacement gate, such as a replacement metal gate (RMG), can then be formed within each cavity around the fin-shaped body. That is, a conformal gate dielectric layer can be deposited and a gate conductor layer can be deposited on the conformal gate dielectric layer (see process 434). Another anisotropic etch process can be performed, again using the combination of the protective dielectric cap 227 and protective dielectric sidewall spacer 228 as a mask pattern, in order to pattern the gate conductor and gate dielectric layers (see process 436 and FIGS. 32A-32C). Process 434 as described above results in a shared gate structure, which is formed around the entire fin-shaped body and this shared gate structure has main sections 220a for each of the VFETs 290 and a shared extension section 220b. Each main section 220a is on the first spacer layer 216 above the substrate and positioned laterally immediately adjacent to the first outer end and first opposing sidewalls of a given one of the semiconductor fins 202. The extension section 220b is also on the first spacer layer 216 above the isolation regions 207 and positioned laterally immediately adjacent to the second opposing sidewalls of the lower portion 214a of the isolation fin 214. The upper portion 214b of the isolation fin 214 extends vertically above the level of the top surface of the gate at the extension section 220b.

Optionally, gate cut isolation regions 255 can be formed through side portions of the sacrificial gate 217 adjacent to the second opposing sidewalls of the isolation fin 214 (i.e., before process 432) so that, when process 434 is completed, discrete gates (each with a main section 220a and extension section 220b) are form for each VFET 290. Optionally, gate cut isolation regions 255 could instead be formed through side portions of a shared extension section following process 434 in order to divide the shared gate structure into discrete gates (each with a main section 220a adjacent to a semiconductor fin 202 and an extension section 220b adjacent to the second opposing sidewalls at one end of the isolation fin 214 (see FIGS. 2A-2D and, particularly, FIG. 2D).

Additional processing to complete the VFETs 290 can include, but is not limited to, the following (see process 438 and FIGS. 2A-2D). A first layer 251 of interlayer dielectric (ILD) material can be deposited and polished (e.g., using a CMP process) to expose the protective dielectric caps 227. The protective dielectric caps 227 can then be selectively removed. The dielectric material of the protective dielectric caps 227 should be different from the ILD material of the first layer 251 in order to allow for selective etching of the protective dielectric caps. In any case, a second layer 252 of ILD material can be deposited onto the second S/D regions 225 and the top surface of the first layer 251 of ILD material. The ILD material can be any of silicon dioxide, borophosphosilicate glass (BPSG), tetraethyl orthosilicate (TEOS), fluorinated tetraethyl orthosilicate (FTEOS), etc.

Contact openings to the S/D regions (not shown) and to the extension section(s) 220b can be formed (e.g., lithographically patterned and selectively and anisotropically etched). Each gate contact opening can, for example, specifically be patterned and etched such that it extends through the second layer 252 of ILD material, lands on the second top surface of the isolation fin 214 and further extends essentially vertically down through the protective dielectric sidewall spacer 228 along the second opposing sidewalls of the upper portion 214b of the isolation fin 214 to the top surface of the extension section 220b. Contacts, including S/D contacts (not shown) and gate contacts 130, can then be formed in the gate contact openings. Techniques for forming contacts in contact openings are well known in the art and, thus, the details of these techniques have been omitted from the specification in order to allow the reader to focus on the salient aspects of the disclosed methods.

In the above-described structures and methods, different dopants can be used to achieve the desired conductivity types in the S/D regions and channel region of each VFET. Those skilled in the art will recognize that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of dopants.

Additionally, in the above-described structures and methods, the gate dielectric layer can be made, for example, of silicon dioxide or a high-K gate dielectric material. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The gate conductor layer can be made, for example, of doped polysilicon. Alternatively, the gate conductor layer can be made of a conformal work function metal or metal alloy material that is preselected in order to achieve the optimal gate conductor work function given the conductivity type of the VFET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a transistor comprising:
      a first source/drain region in a substrate;
      a fin-shaped body comprising a semiconductor fin on the first source/drain region, the semiconductor fin having a first top surface and first opposing sidewalls;
      a second source/drain region on the first top surface of the semiconductor fin; and,
      a gate comprising a main section above the substrate and adjacent to the first opposing sidewalls of the semiconductor fin,
         wherein the fin-shaped body further comprises an isolation fin positioned laterally immediately adjacent to and in end-to-end alignment with the semiconductor fin such that the semiconductor fin and the isolation fin are essentially perpendicular to the substrate, such that the semiconductor fin and the isolation fin are oriented in a same direction across the substrate, and such that an end of the semiconductor fin abuts an adjacent end of the isolation fin,
         wherein the isolation fin has a second top surface and second opposing sidewalls,
         wherein the isolation fin contacts the first source/drain region,
         wherein the gate further comprises an extension section adjacent to the second opposing sidewalls of the isolation fin, and
         wherein an upper portion of the isolation fin extends vertically above the extension section; and
      a gate contact that contacts the extension section of the gate.

2. The semiconductor structure of claim 1, further comprising an isolation region in the substrate,
   the isolation fin being between the isolation region and the semiconductor fin,
   the main section of the gate further wrapping around a first end of the semiconductor fin,
   the extension section of the gate further extending onto the isolation region and wrapping around a second end of the isolation fin, and
   the gate contact further being adjacent to the second end of the isolation fin above the extension section of the gate.

3. The semiconductor structure of claim 1, the semiconductor structure further comprising isolation regions in the substrate abutting the second opposing sidewalls of the isolation fin.

4. The semiconductor structure of claim 3, the extension section being above and immediately adjacent to the isolation regions.

5. The semiconductor structure of claim 1, further comprising an additional transistor comprising an additional semiconductor fin, the isolation fin being positioned laterally between and immediately adjacent to the semiconductor fin and the additional semiconductor fin.

6. The semiconductor structure of claim 1, further comprising spacer layers electrically isolating the gate from the first source/drain region and the second source/drain region.

7. The semiconductor structure of claim 1, the isolation fin being wider than the semiconductor fin.

8. The semiconductor structure of claim 1, wherein the semiconductor fin has a first bottom surface and the isolation fin has a second bottom surface below a level of the first bottom surface.

9. A semiconductor structure comprising:
   a transistor comprising:
      a first source/drain region in a substrate;
      a fin-shaped body comprising a semiconductor fin on the first source/drain region, the semiconductor fin having a first top surface and first opposing sidewalls;
      a second source/drain region on the first top surface of the semiconductor fin; and,
      a gate comprising a main section above the substrate and adjacent to the first opposing sidewalls of the semiconductor fin,
         wherein the fin-shaped body further comprises an isolation fin positioned laterally immediately adjacent to and in end-to-end alignment with the semiconductor fin such that the semiconductor fin and the isolation fin are essentially perpendicular to the substrate, such that the semiconductor fin and the isolation fin are oriented in a same direction across the substrate, and such that an end of the semiconductor fin abuts an adjacent end of the isolation fin, wherein the isolation fin has a second top surface and second opposing sidewalls, wherein the gate further comprises an extension section adjacent to the second opposing sidewalls of the isolation fin, and wherein an upper portion of the isolation fin extends vertically above the extension section;

a gate contact that contacts the extension section of the gate; and isolation regions in the substrate abutting the second opposing sidewalls of the isolation fin, wherein the extension section is above and immediately adjacent to the isolation regions.

10. The semiconductor structure of claim 9, further comprising an additional transistor comprising an additional semiconductor fin, the isolation fin being positioned laterally between and immediately adjacent to the semiconductor fin and the additional semiconductor fin.

11. The semiconductor structure of claim 9, further comprising spacer layers electrically isolating the gate from the first source/drain region and the second source/drain region.

12. The semiconductor structure of claim 9, the isolation fin being wider than the semiconductor fin.

13. The semiconductor structure of claim 9, wherein the isolation fin contacts the first source/drain region.

14. The semiconductor structure of claim 9, wherein the semiconductor fin has a first bottom surface and the isolation fin has a second bottom surface that is below a level of the first bottom surface.

15. A semiconductor structure comprising:
a transistor comprising:
a first source/drain region in a substrate;
a fin-shaped body comprising a semiconductor fin on the first source/drain region, the semiconductor fin having a first top surface and first opposing sidewalls;
a second source/drain region on the first top surface of the semiconductor fin; and,
a gate comprising a main section above the substrate and adjacent to the first opposing sidewalls of the semiconductor fin, wherein the fin-shaped body further comprises an isolation fin positioned laterally immediately adjacent to and in end-to-end alignment with the semiconductor fin such that the semiconductor fin and the isolation fin are essentially perpendicular to the substrate, such that the semiconductor fin and the isolation fin are oriented in a same direction across the substrate, and such that an end of the semiconductor fin abuts an adjacent end of the isolation fin, wherein the isolation fin has a second top surface and second opposing sidewalls, wherein the gate further comprises an extension section adjacent to the second opposing sidewalls of the isolation fin, and wherein an upper portion of the isolation fin extends vertically above the extension section;

a gate contact that contacts the extension section of the gate;

isolation regions in the substrate abutting the second opposing sidewalls of the isolation fin; and an additional transistor comprising an additional semiconductor fin, the isolation fin being positioned laterally between and immediately adjacent to the semiconductor fin and the additional semiconductor fin.

16. The semiconductor structure of claim 15, the extension section being above and immediately adjacent to the isolation regions.

17. The semiconductor structure of claim 15, further comprising spacer layers electrically isolating the gate from the first source/drain region and the second source/drain region.

18. The semiconductor structure of claim 15, the isolation fin being wider than the semiconductor fin.

19. The semiconductor structure of claim 15, wherein the isolation fin contacts the first source/drain region.

20. The semiconductor structure of claim 15, wherein the semiconductor fin has a first bottom surface and the isolation fin has a second bottom surface that is below a level of the first bottom surface.

* * * * *